(12) United States Patent
Yang

(10) Patent No.: US 9,843,341 B1
(45) Date of Patent: Dec. 12, 2017

(54) METHODS AND DEVICES FOR SPARSE DATA COMPRESSION THROUGH DIMENSION CODING

(71) Applicant: Multicom Technologies Inc., Petersburg (CA)

(72) Inventor: En-Hui Yang, Petersburg (CA)

(73) Assignee: Multicom Technologies Inc., Petersburg, Ontario (CA)

( * ) Notice: Subject to any disclaimer, the term of this patent is extended or adjusted under 35 U.S.C. 154(b) by 0 days.

(21) Appl. No.: 15/666,676

(22) Filed: Aug. 2, 2017

Related U.S. Application Data

(60) Provisional application No. 62/369,910, filed on Aug. 2, 2016.

(51) Int. Cl.
*H03M 7/34* (2006.01)
*H03M 7/30* (2006.01)
*G06F 17/30* (2006.01)

(52) U.S. Cl.
CPC ...... *H03M 7/3082* (2013.01); *G06F 17/3069* (2013.01); *G06F 17/30681* (2013.01)

(58) Field of Classification Search
CPC ... H03M 7/3082; H03M 7/30; G06F 17/3069; G06F 17/30681; G06F 17/30
USPC .............................................. 341/50, 51, 87
See application file for complete search history.

(56) References Cited

U.S. PATENT DOCUMENTS

| 5,195,137 | A | * | 3/1993 | Swaminathan | ......... | G06T 9/008 |
| | | | | | | 704/201 |
| 6,762,699 | B1 | | 7/2004 | Yang | | |
| 6,801,141 | B2 | | 10/2004 | Yang et al. | | |
| 8,711,015 | B2 | * | 4/2014 | Mustiere | ................. | H03M 7/30 |
| | | | | | | 341/87 |
| 2011/0119031 | A1 | * | 5/2011 | Castro | ................. | H03M 7/3062 |
| | | | | | | 702/181 |
| 2012/0316886 | A1 | * | 12/2012 | Pishehvar | ............. | G10L 19/032 |
| | | | | | | 704/500 |

OTHER PUBLICATIONS

"Robust Uncertainty Principles: Exact Signal Reconstruction From Highly Incomplete Frequency Information"; Emmanuel J. Candés, Justin Romberg, Member, IEEE, and Terence Tao, IEEE Transactions on Information Theory, vol. 52, No. 2, Feb. 2006.
"Near-Optimal Signal Recovery From Random Projections: Universal Encoding Strategies?"; Emmanuel J. Candes and Terence Tao; IEEE Transactions on Information Theory, vol. 52, No. 12, Dec. 2006.
"Compressed Sensing"; David L. Donoho, Member, IEEE; IEEE Transactions on Information Theory, vol. 52, No. 4, Apr. 2006.
(Continued)

*Primary Examiner* — Jean B Jeanglaude
(74) *Attorney, Agent, or Firm* — Rowand LLP

(57) ABSTRACT

Methods and devices for encoding a sparse signal x to generate a compressed encoded signal. The methods employ directionless grammar-based dimension coding. Using labelled subsets and the finding of disjoint repeated subsets in order to build a directionless grammar, the non-zero positions of the sparse signal are encoded in a directionless grammar-based dimension encoder. Element values are encoded in a conditional non-zero encoder. The coding process facilitates random access.

19 Claims, 6 Drawing Sheets

(56) References Cited

OTHER PUBLICATIONS

Correspondence, "Performance Analysis of Grammar-Based Codes Revisited"; Da-ke He, Member, IEEE, andEn-hui Yang, Senior Member, IEEE; IEEE Transactions on Information Theory, vol. 50, No. 7, Jul. 2004.

"Grammar-Based Codes: A New Class of Universal Lossless Source Codes"; John C. Kieffer, Fellow, IEEE, and En-hui Yang, Member, IEEE; IEEE Transactions on Information Theory, vol. 46, No. 3, May 2000.

"Efficient Universal Lossless Data Compression Algorithms Based on a Greedy Sequential Grammar Transform—Part One: Without Context Models"; En-hui Yang, Member, IEEE, and John C. Kieffer, Fellow, IEEE; IEEE Transactions on Information Theory, vol. 46, No. 3, May 2000.

"Compression of Individual Sequences via Variable-Rate Coding"; Jacob Ziv, Fellow, IEEE, and Abraham Lempel, Member, IEEE; IEEE Transactions on Information Theory, vol. IT-24, No. 5, Sep. 1978.

\* cited by examiner

METHODS AND DEVICES FOR SPARSE DATA COMPRESSION THROUGH DIMENSION CODING

CROSS-REFERENCE TO RELATED APPLICATIONS

The present application claims priority to U.S. provisional application 62/369,910 filed Aug. 2, 2016, the contents of which are hereby incorporated by reference.

FIELD

The present application generally relates to sparse data compression and, in particular, sparse data compression through the use of directionless grammar-based dimension coding.

BACKGROUND

Data compression is used in communications and computer networking to store, transmit, and reproduce information efficiently. Modern compression techniques, such as video compression, often rely on predictive coding and compress data in a manner that may make random access impossible without decoding a large portion of the data. This may also hamper searching and/or other forms of computation without decoding.

It would be advantageous to have new mechanism for encoding and decoding data that achieves compression efficiencies and yet facilitates random access and/or other forms of computation.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
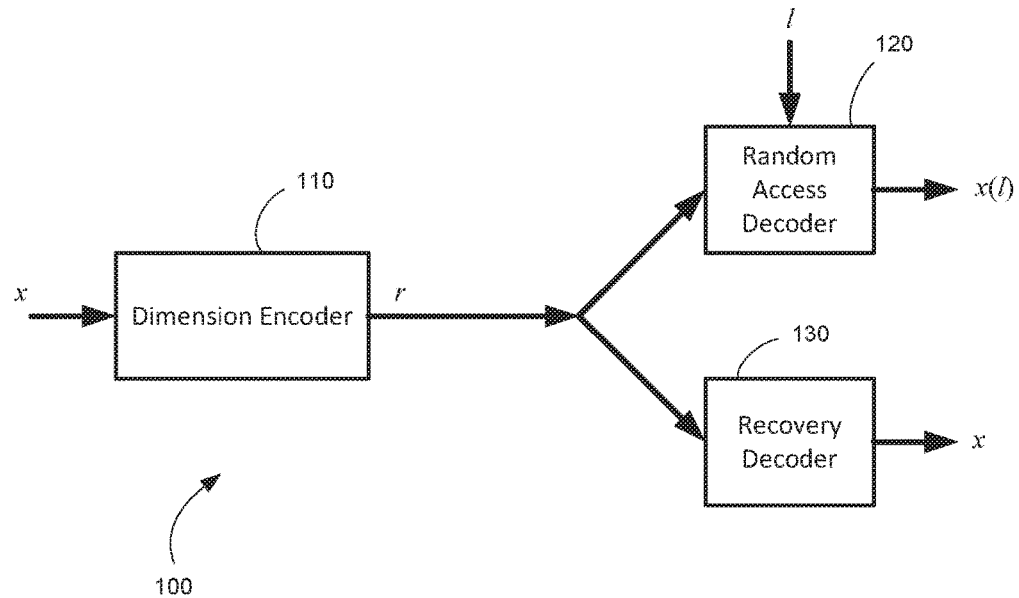
FIG. 1 shows an example dimension coding system.

The present application describes methods and devices for sparse data compression that use dimensionless grammar-based coding. The methods and devices may be used to particular advantage in coding large sparse signals; that is, signals that contain a large number of zero values. Dimension encoding is used to represent the sparse signal in a compressed form as a vector r. A compressed vector representation of the sparse signal is advantageous if it can be decompressed to recover the sparse signal relatively quickly and if a component of the sparse signal can be recovered from the vector in relatively quickly. The latter is referred to as a random access decoding of the vector.

The present application provides for methods and devices that compress a sparse signal and enable random access to component and full decoding of the sparse signal in a manner that achieves processing time constraints and compression advantages. Accordingly, the compressed signal may be transmitted used less bandwidth or processed using less memory capacity than in some existing coding systems.

In a first aspect, the present application describes a method of encoding a sparse signal x to generate a compressed encoded signal, wherein the sparse signal x may be expressed as a set of non-zero positions in the sparse signal x and the component values of each respective non-zero position. The method may include generating a set $P(x)$ representing the set of non-zero positions in the sparse signal and transforming the set $P(x)$ into a localized directionless grammar G from which the set $P(x)$ can be recovered. The localized directionless grammar G is defined by a set of production rules, each containing two or more labelled sets. At least two of the labelled sets contain a variable associated with one of the production rules, the variable representing a disjoint, repeated subset within the set $P(x)$. Subsets represented by distinct variables are distinct up to translation. The method may further include using a grammar dimension encoder to encode the localized directionless grammar G into an output vector; and encoding the values of the non-zero components of the sparse signal x conditionally given the localized directionless grammar G.

In some implementations, the transforming the set $P(x)$ into a localized directionless grammar G may include generating an initial directionless grammar consisting of an initial production rule containing, as its right member, a plurality of labelled sets, the plurality including one labelled set for each element in the set $P(x)$; finding a disjoint repeated subset with cardinality greater than or equal to 2 within the plurality of labelled sets; subtracting the disjoint repeated subset from the initial production rule with trace at the least position of elements in the repeated subset; generating a new production rule representing a translation of the repeated subset, the new production rule being associated with a new variable; and generating a revised directionless grammar comprising the initial production rule and the new production rule.

In another aspect, encoding the localized directionless grammar may include, using a prescribed set of grouping rules, rearranging elements of the localized directionless grammar so as to group elements in each production rule based on whether they contain a terminal symbol or a variable; traversing the elements of the production rules in a prescribed order and extracting element information to form a first vector from the extracted element information; replacing the terminal symbol and any variables in the first vector with prescribed indices; generating a second vector encoding the number of variables and terminal symbols in respective production rules; and forming the output vector from the first vector, the second vector and size information for at least one of the first vector and the second vector.

In another aspect, the present application describes a method of randomly accessing a component of a sparse signal through a vector representing compression of the sparse signal x without full decoding of the vector, the vector being formed as concatenation of at least a first vector and a second vector, the vectors having resulted from grammar dimension encoding of a localized directionless grammar, the localized directionless grammar representing a transform of a set P(x) representing the non-zero positions in the sparse signal, the first vector being an encoding of position and variable information for production rules of the localized directionless grammar, the second vector being an encoding of the number of variables and terminal symbols in respective production rules. The method may include initializing a position offset based on an input index to the sparse signal; recursively, determining whether, using a bisection method applied to the first vector and using the second vector, the position offset appears in one of two selected elements of the first vector and, if so, outputting a determination that the input index is a non-zero value of the sparse signal, and, if not, determining whether a condition for halting the recursive determining is met and, if so, outputting a determination that the input index is a zero value of the sparse signal, and, if not, updating the position offset and repeating the recursive determining.

In a further aspect, the present application describes encoders and decoders configured to implement such methods of encoding and decoding.

In yet a further aspect, the present application describes non-transitory computer-readable media storing computer-executable program instructions which, when executed, cause one or more processors to perform the described methods of encoding and/or decoding.

Other aspects and features of the present application will be understood by those of ordinary skill in the art from a review of the following description of examples in conjunction with the accompanying figures.

In the present application, the term "and/or" is intended to cover all possible combinations and sub-combinations of the listed elements, including any one of the listed elements alone, any sub-combination, or all of the elements, and without necessarily excluding additional elements.

In the present application, the phrase "at least one of . . . or . . . " is intended to cover any one or more of the listed elements, including any one of the listed elements alone, any sub-combination, or all of the elements, without necessarily excluding any additional elements, and without necessarily requiring all of the elements.

A significant portion of data types in big data are sparse either in their original collected form such as data in economics and finance or after conversion to sparse representation such as through transform and/or quantization. With an enormous amount of sparse data around us, a big challenge is how to make sense of them in whatever way one could define. The very first step in the "making sense" process is to store and compute these sparse data. Due to their sheer sizes, operating on sparse signals directly in the space of their original dimensions may not be practically feasible. As will be demonstrated below, dimension coding can reduce the number of dimensions dramatically while facilitating computation directly over the resulting compressed dimension representation. In addition, grammar-based dimension coding also helps identify and exploit patterns within data sets themselves. Therefore, it is expected that dimension coding will be an effective tool for big data analytics.

Sparse signals occur in a number of contexts. Sparsity has been extensively explored in image and video coding. Indeed, all image and video coding standards developed so far rely on sparse representations of images/videos in either transform domains, or prediction residual domains, or both. However, a common problem is that compressed images/videos according to these standards do not facilitate random access to each individual transform coefficient or block of transform coefficients without first going through the bit level decompression process. In the context of large scale image/video management, going through the bit level decompression process to get any computation over compressed images/videos done is expensive and may not be practically feasible in some cases. Applying dimension coding to image and video coding provides for new image and video coding methods that not only improve the compression performance, but also facilitate computation over compressed images and videos.

As another example, although text does not necessarily directly involve a sparse signal, there are many derived sparse signals associated with text to be compressed. For example, partitions of the sequence into non-overlapping blocks of variable length and occurrence positions of key words from a dictionary in the sequence can all be used to generate derived sparse signals for the sequence. It is possible to establish a framework within which traditional data compression and dimension coding of derived sparse signals can interplay with each other and be combined to provide random access of uncompressed data through compressed data while achieving asymptotically the entropy rate of the sequence to be compressed and enabling key word search over compressed data.

For the purposes of the following description, consider the following definition of a sparse signal:

$$x = [x(0), x(1), \ldots, x(n-1)]$$

with $$\alpha(x) = \frac{w(x)}{n} \ll 1$$

where $w(x) \geq 2$ denotes the number of nonzero components in x, and a(x) is referred to as the density of x. Assume each nonzero component in x takes a value of b bits. The present application provides methods and devices to represent x with a minimal number of dimensions while facilitating computation over the resulting compressed dimension representation of x.

A compressed dimension representation of x may be represented as vector $r=[r(0), r(1), \ldots r(m-1)]$ in which $m \ll n$ and each component $r(i)$, $0 \leq i \leq m-1$, takes at most $\lceil \log n \rceil$ bits, and from which x can be recovered perfectly. Here and throughout the rest of the present application, log stands for the logarithm with base 2. To facilitate computation over r, it is reasonable to target that (1) each component $x(l)$, $0 \leq l \leq n-1$, of the original signal x can be accessed through vector r in no more than a polynomial time of log w(x), say $O(\log^2 w(x))$, and (2) the whole original signal x can be recovered from vector r in a linear time of w(x).

Reference is now made to FIG. 1, which shows, in block diagram form an example dimension coding system 100. The system 100 includes a dimension encoder 110 that encodes the sparse signal x as vector r. At the decoding side, there are two types of possible decoders: a random access decoder 120 that takes the vector r and an index l as inputs and outputs x(l), and a recovery decoder 130 that decodes (e.g. reconstructs) the sparse signal x from the vector r.

Together, the dimension encoder 110 and the corresponding random access decoder 120 and recovery decoder 130 are referred to as a dimension code. Under the constraints of $O(\log^2 w(x))$ time complexity on the random access decoder 120 and $O(w(x))$ time complexity on the recovery decoder 130, one may design dimension codes so that the compressed dimension m is as small as possible.

A linear encoder may be used as the dimension encoder 110, but the compression is suboptimal. Indeed, the dimension rate in dimensions per nonzero in compressed sensing still goes to infinity at the speed of O(logn) as n→∞. In addition, random access of x(l) through the resulting compressed dimension representation r does not seem possible, and the recovery of x from r is also very expensive.

A non-linear encoder may offer improvements in performance. Let P(x) denote the set of positions of nonzero components in x, i.e., $$P(x)=\{l:x(l)\neq 0,\ 0\leq l\leq n-1\}$$

Assume that $b\leq \lceil \log n \rceil$. A trivial nonlinear encoder would simply record elements in P(x) along with the corresponding component values, x(l), l∈P(x), and the cardinality of P(x). That is, the output of the trivial nonlinear encoder in response to the input x is $$r=[r(0), r(1), \ldots, r(w(x)), \ldots, r(2w(x))] \qquad (1)$$

where r(0)=w(x), the next w(x) components in r are the elements in P(x) listed in the increasing order, and the last w(x) components in r are the corresponding component values, x(l), l∈P(x). Having r(0)=w(x) makes r self-delimiting in the sense that if one reads components of r from left to right, one can determine whether or not the current component is the end without looking ahead. Using the bisection method, each x(l), 0≤l≤n−1, can be accessed through r in (1) in O(logw(x)) time. Since P(x) and {x(l): l∈P(x)} determine x, x can be recovered from r in (1) in O(w(x)) time. The number of dimensions in r is now 2w(x)+1. In comparison with the result of linear encoders mentioned above, the factor logn is gone.

As shown below, it is possible to make further improvements. As an illustrative example, suppose that P(x) can be partitioned into two disjoint subsets $S_1$ and $S_2$, where $S_2$ is a translation of $S_1$. Translate $S_1$ to the left so that the smallest integer in the translated $S_1$ is 0 and denote the resulting translated $S_1$ by S. Let $l_1$ and $l_2$ be the smallest integers in $S_1$ and $S_2$, respectively. Then one can modify r in (1) by recording only $l_1$, $l_2$, and integers in S in the increasing order along with the corresponding component values, x(l), l∈P(x), and the cardinality of S. If $S_1$ and $S_2$ do not overlap in their time spans, that is, the largest integer in $S_1$ is less than the smallest integer in $S_2$, then the O(logw(x)) time random access of x(l) through and the O(w(x)) time recovery of x from the resulting modified r are still maintained. The required number of dimensions in r is further reduced to 3+1.5w(x).

The above example suggests that it is possible to reduce the required number of dimensions in r while satisfying the desirable constraints on the time complexity of the random access decoder 120 and recovery decoder 130 if patterns within P(x) are discovered and exploited. To systematically discover and utilize patterns within P(x), the present application describes a new concept termed "directionless grammar" by extending the concept of context free grammar in grammar-based coding. In grammar-based coding, a context free grammar is used to represent a string with its variables representing substrings of that string. In contrast, the present application describes a directionless grammar that represents a set with its variables representing subsets of that set. Based on the concept of directionless grammar, a dimension coding process is described below within which x is first transformed into a directionless grammar and then encoded indirectly into the vector r. The inherent structure of directionless grammar also facilitates the design of the corresponding random access decoder 120 and recovery decoder 130, satisfying the desired time complexity constraints.

Figure 2:
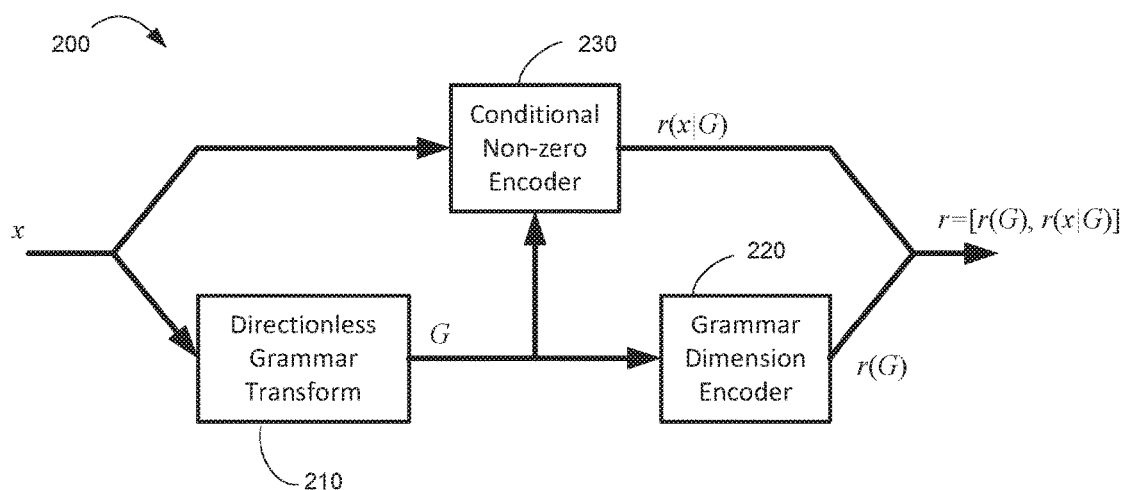
FIG. 2 shows an example of a grammar-based dimension encoder.

Reference is now made to FIG. 2, shows a simplified block diagram of a directionless grammar-based dimension encoder 200. The encoder 200 includes a directionless grammar transform 210 that generates a directionless grammar G based on the sparse signal x. The directionless grammar G is encoded into a vector r(G) by a grammar dimension encoder 220. The sparse signal x is also encoded using a conditional non-zero encoder 230 that also receives the grammar G to produce a second vector r(x|G). Together, the vectors r(G) and r(x|G) form the compressed representation vector r.

Notation and Terminology

For the purposes of the description and discussion below, it may be helpful to provide some definitions and a review of terminology as it will be used in the present application.

Let N denote the set of all integers, and $N^+$ the set of all positive integers. For any i, j∈N with i≤j, [i:j] may be used as a shorthand for the set {i, i+1, . . . , j}. For any n∈$N^+$, let $R_n$ denote the set of all vectors of any dimensions with their components taking values over [0; $2^{\lceil \log n \rceil}$−1]. The generic notation |A| stands for the cardinality of A if A is a finite set, the size of A if A is a directionless grammar (to be defined later), and the number of dimensions of A if A is a vector. The exact meaning of |A| will be clear from the context. For example, for the sparse signal x=[x(0), x(1), . . . , x(n−1)], the notation |x| means the number of dimensions of x, i.e., |x|=n. For a finite alphabet A with |A|≥2, $A^+$ denotes the set of all finite strings of positive length from A.

Let V ={$v_0$, $v_1$, $v_2$, . . . } be a countably infinite set disjoint with N. Elements in V are called variables. Let Σ be a nonempty finite set disjoint with both N and V. Elements in Σ are called terminal symbols. A labeled set is a pair (S, L) such that S is a set, and L is a labeling function which assigns to each element y∈S a label L(y). To be specific, the labeled set (S, L) is often written as $$(S, L)=\{(y, L(y)):y\in S\} \qquad (2)$$

The cardinality |(S, L)| of the labeled set (S, L) is the same as |S|. In the present application, labeled sets are limited only to those for which S is a subset of N, and L takes values over V ∪Σ. For any set U ⊂ V ∪Σ, let S(U) denote the set of all finite labeled sets (S, L) with S ⊂ N and L taking values over U. A labeled set ($S_1$, $L_1$) is said to be a subset of another labeled set ($S_2$, $L_2$) if $$\{y, L_1(y)):y\in S_1\} \subset \{(y, L_2(y)):y\in S_2\}$$

Two labeled sets ($S_1$, $L_1$) and ($S_2$, $L_2$) are said to be disjoint if $S_1$ and $S_2$ are disjoint. For each element (i, L(i)) in a labeled set (S, L)∈S(V ∪Σ), the integer i is referred to as the position of the element while L(i) is also called the label of that element.

The term "ordered set" referes to a pair (S, ≤) such that S is a set, and ≤ is a transitive binary relation on S under which any pair of elements in S are comparable. As such, when S is finite, one can list its elements in the increasing order under ≤:

$$y_0 \leq y_1 \leq \ldots \leq y_{|S|-1}$$

Therefore, when the binary relation ≤ is known from the context, one can identify the ordered set (S, ≤) with the vector [S] given by $$[S]=[y_0, y_1, \ldots, y_{|S|-1}]$$

For example, for the sparse signal x=[x(0), x(1), . . . , x(n−1)], P(x) endowed with the natural order of integers is an ordered set. With this natural order, $$[P(x)]=[i_1, i_2, \ldots, i_{w(x)}]$$

if $P(x)=\{i_j:1\leq j\leq w(x)\}$ and $$i_1<i_2<\ldots<i_{w(x)}$$

For any set $S\subset N$ and any $i\in N$, define $$S+i=\{j+i:j\in S\}$$

The set $S+i$ is said to be a translation of $S$ by $i$. A set $S$ is said to repeat itself at least twice as subsets of $P(x)$ in a disjoint manner if there exist $i$ and $j$ such that both $S+i$ and $S+j$ are disjoint subsets of $P(x)$, in which case $S+i$ and $S+j$ are also said to be repeated subsets of $P(x)$. Likewise, a labeled set $(S_1, L_1)\in S(U)$ is said to be a translation of another labeled set $(S_2, L_2)\in S(U)$ by $i\in N$ if $S_1=S_2+i$ and $L_1(j+i)=L_2(j)$ for any $j\in S_2$. This may be expressed as:

$$(S_1, L_1)=(S_2, L_2)+i$$

A labeled set $(S_1, L_1)$ is said to repeat itself at least twice as subsets of a labeled set $(S, L)$ in a disjoint manner if there exist $i$ and $j$ such that both $(S_1, L_1)+i$ and $(S_1, L_1)+j$ are disjoint subsets of $(S, L)$, in which case $(S_1, L_1)+i$ and $(S_1, L_1)+j$ are also said to be repeated subsets of $(S, L)$. The repetition terminology also applies to the case as subsets of more than one labeled sets.

Context Free Grammar

Before describing the new notion of directionless grammar, for comparison purposes it may help to first describe the concept of context free grammar (CFG) in grammar-based coding for lossless compression.

Let $V\subset \mathcal{V}$ be a finite set containing $v_0$. A CFG with variable set $V$, terminal symbol set $\Sigma$, and start variable $v_0$ is a mapping $G$ from $V$ to $(V\cup\Sigma)^+$. For each $v\in V$, the correspondence $v\to G(v)$ is called a production rule. Therefore, given $V$, $\Sigma$, and $v_0$, a CFG $G$ can be equivalently described by its set of production rules $\{v\to G(v):v\in V\}$.

Given a CFG $G$, start with $v_0$ and replace in parallel each variables $v$ in $G(v_0)$ by $G(v)$. The result is another string from $V\cup\Sigma$. This parallel replacement continues until:

P1. after finitely many parallel replacement steps, we get a string $x$ from $\Sigma$; or P2. the parallel replacement procedure never ends because the string so obtained at each step always contains a variable $v\in V$.

In grammar-based coding, the objective is to obtain a grammar $G$ for which the parallel replacement procedure ends up with State P1 and every production rule $v\to G(v)$ is used at least once in the whole replacement procedure. Such a CFG $G$ is called an admissible context-free grammar, and the string $x$ from $\Sigma$ obtained at State P1 is said to be represented by $G$ or the start variable $v_0$. Since in this case, each production rule is used at least once, all other variables $v$ in $V$ represent sub strings of $x$.

As an illustrative example, Example 1, consider $\Sigma=\{0, 1\}$ and $V=\{v_0, v_1, v_2, v_3\}$ with $v_0$ designated as the start variable. The set of production rules below then defines an admissible CFG $G$:

$$v_0\to 0v_1v_2v_10v_2$$

$$v_1\to v_2v_3$$

$$v_2\to 0v_3$$

$$v_3\to 101$$

Start with $v_0$ and perform the parallel replacement:

$$v_0\to 0v_1v_2v_10v_2\to 0v_2v_310v_3v_2v_300v_3\to 00v_3101101010v_3$$
$$10100101\to 00101101101010110100101$$

The CFG $G$ or $v_0$ represents $x=00101101101010110100101$ with $v_1$, $v_2$, $v_3$ representing substrings 0101101, 0101, and 101, respectively.

Since each $G(v)$ is a string from $(V\cup\Sigma)$, CFGs defined above are direction oriented. In other words, entries in $G(v)$ are ordered from left to right; replacement of $v$ by $G(v)$ in the parallel replacement procedure follows the same order constraint; and re-ordering entries in $G(v)$ would result in different CFGs representing different $x$. On the other hand, elements in a set have no order. As such, CFGs defined above are not applicable to sets.

Directionless Grammar

For the purposes of the description below, assume that $\Sigma$ is a singleton, i.e., $\Sigma=\{\sigma\}$. For any finite set $S\subset N$, there is a corresponding labeled set $(S, L_\sigma)$ from $S(\Sigma)$. Note that all labels in $(S, L_\sigma)$ are the same and equal to $\sigma$. $S$ is identified with its corresponding labeled set $(S, L_\sigma)$. Before defining the notion of directionless grammar, two more labeled set operations on $S(V\cup\Sigma)$ are described below which operate to contract or expand an existing labeled set and create new labeled sets from it.

Labeled Set Subtraction With Trace: Let $(S_1, L_1)$ be a subset of $(S, L)\in S(V\cup\Sigma)$. Subtracting $(S_1, L_1)$ from $(S, L)$ with trace at $i\in S_1$ means that $(S_1, L_1)$ is subtracted from $(S, L)$ and then a new labeled element $(i, v)$ is inserted into $(S, L)$, where $v\in V$ is a new variable which has never appeared in $(S, L)$ before and is designated to represent the labeled set $(S_1, L_1)-i$.

If $(S_1, L_1)+j$ is another subset of $(S, L)\in S(V\cup\Sigma)$, disjoint with $(S_1, L_1)$, subtracting $(S_1, L_1)$ and $(S_1, L_1)+j$ simultaneously from $(S, L)$ with trace at $i\in S_1$ means that both $(S_1, L_1)$ and $(S_1, L_1)+j$ are both subtraced from $(S, L)$ and then two new labeled elements $(i, v)$ and $(i+j, v)$ are inserted into $(S, L)$, where $v\in V$ is a new variable which has never appeared in $(S, L)$ before and is designated to represent the labeled set $(S_1, L_1)-i$. The same principle applies to subtracting simultaneously more than two repetitions of a subset from $(S, L)$ with trace.

As an illustrative example, Example 2, consider the labeled set $(S, L)$ given by:

$$(S, L)=\{(2, v_1), (8, \sigma), (7, v_2), (14, v_1), (20, \sigma)\}$$

It contains two disjoint subsets $\{(2, v_1), (8, \sigma)\}$ and $\{(14, v_1), (20, \sigma)\}$ which are a repetition of each other. Subtracting simultaneously these two disjoint subsets from $(S, L)$ with trace at $i=2$ yields $$\{(2, v_3), (7, v_2), (14, v_3)\}$$

with $v_3$ representing $\{(0, v_1), (6, \sigma)\}$.

Labeled Set Addition With Trace: Let $(S_1, L_1)$ and $(S_2, L_2)$ be two labeled sets from $S(V\cup\Sigma)$. Suppose that $S_1+i$, $i\in S_2$, is disjoint with $S_2-\{i\}$. Adding $(S_1, L_1)$ into $(S_2, L_2)$ with trace at $i\in S_2$ means that the element $(i, L_2(i))$ is deleted from $(S_2, L_2)$ and then all elements in $(S_1, L_1)+i$ are inserted into $(S_2, L_2)$. Denote this operation by:

$$(S_1, L_1)+(S_2, L_2)_i$$

Then, mathematically:

$$(S_1, L_1)+(S_2, L_2)_i=((S_1, L_1)+i)\cup((S_2, L_2)-\{(i, L_2(i))\}) \quad (3)$$

if $i\in S_2$ and $(S_1+i)\cap(S_2-\{i\})=\emptyset$; it is not defined otherwise.

As an illustrative example, Example 3, consider:

$$(S_1, L_1)=\{(0, v_1), (6, \sigma)\}$$

and $$(S_2, L_2)=\{(2, v_3), (7, v_2), (14, v_3)\}$$

Then, $$(S_1, L_1)+(S_2, L_2)_{i=2}=\{(2, v_1), (8, \sigma), (7, v_2), (14, v_3)\}$$

Adding $(S_1, L_1)$ to the above labeled set at i=14 again yields the labeled set (S, L) in Example 2. Since there is no conflict, adding $(S_1, L_1)$ to $(S_2, L_2)$ at i=2 and i=14 in parallel yields the same (S, L).

With the above understanding, a directionless grammar and its manner of construction can now be defined with reference to labelled sets. Let $V \subset \mathcal{V}$ be a finite set containing $v_0$. Given V and $\Sigma=\{\sigma\}$, a directionless grammar with variable set V, terminal symbol set $\Sigma$, and start variable $v_0$ is a mapping G from V to $S(V \cup \Sigma)$ such that:

for any $v \in V$, $|G(v)| \geq 2$; and for any $v \neq v_0$, the labeled set G(v) contains an element the position of which is 0, i.e., (0, u) for some $u \in V \cup \Sigma$.

For any $v \in V$, the correspondence $v \rightarrow G(v)$ is called the production rule corresponding to v; and G(v) is also referred to as the right member of the production rule. Therefore, given V, $\Sigma$, and $v_0 \in V$, a directionless grammar G can be explicitly specified by its set of production rules $\{v \rightarrow G(v): v \in V\}$.

Given a directionless grammar G, the process of building it to represent a finite set $S^* \subset N$ is explained. Start with $v_0$ and add in parallel, for each element (i, v) in $G(v_0)$ with variable label v, G(v) into $G(v_0)$ with trace at i. Then one of the following will happen:

P3. one of the labeled set additions with trace fails since it is not defined;

P4. a collision happens in the sense that a new position j is inserted at lease twice by different additions at different i; or P5. neither of P3 and P4 happens, and we get another labeled set $(S, L) \in S(V \cap \Sigma)$.

If P3 or P4 holds, declare a failure and stop. If P5 holds, repeat the parallel addition process for the newly derived labeled set (S, L). Keep doing this parallel addition process for each newly derived labeled set $(S,L) \in S(V \cap \Sigma)$. Then one of the following holds:

P6. The process terminates because a failure is declared.

P7. The process terminates, and we get a labeled set $(S^*, L_\omega) \in S(\Sigma)$.

P8. The process never ends since each newly derived labeled set $(S, L) \in S(V \cap \Sigma)$ contains an element with a variable $v \in V$.

If P7 holds and each G(v), $v \neq v_0$, is added at least once during the whole sequence of parallel addition processes, then the directionless grammar G is said to be "admissible"; in this case, G or $v_0$ is said to represent the labeled set $(S^*, L_\omega)$ or equivalently $S^*$. Since each G(v), $v \neq v_0$, is added at least once when G is admissible, each other variable $v \neq v_0$ represents a translation of a subset of $S^*$.

The above process may be illustrated by way of Example 4. Let $V=\{v_0, v_1, v_2\}$. The set of production rules below defines an admissible directionless grammar G:

$$v_0 \rightarrow \{(2, v_1), (14, v_1), (8, \sigma)\}$$

$$v_1 \rightarrow \{(0, v_2), (3, v_2), (8, v_2)\}$$

$$v_2 \rightarrow \{(0, \sigma), (2, \sigma)\}$$

Start with $v_0$ and perform repeatedly the parallel addition process:

$$v_0 \rightarrow \{(2, v_1), (14, v_1), (8, \sigma)\} \quad (4)$$

$$\rightarrow \{(2, v_2), (5, v_2), (10, v_2), (14, v_2), (17, v_2), (22, v_2), (8, \sigma)\} \quad (5)$$

$$\rightarrow \{(2, \sigma), (4, \sigma), (5, \sigma), (7, \sigma), (10, \sigma), (12, \sigma), (14, \sigma), (16, \sigma), (17, \sigma), (19, \sigma), (22, \sigma), (24, \sigma), (8, \sigma)\} \quad (6)$$

P7 holds, and the derived labeled set in (6) contains no variable. In this case, G or $v_0$ represents $$S^*=\{2, 4, 5, 7, 8, 10, 12, 14, 16, 17, 19, 22, 24\}$$

Each element (i, v) with variable label v in each of the derived labeled sets (S, L) above (from (4) to (5)) represents a subset of $S^*$. For example, $(14, v_1)$ represents the subset $\{14, 16, 17, 19, 22, 24\}$ while $(5, v_2)$ represents the subset $\{5, 7\}$. Each of the other variables represents a translation of a subset of $S^*$: $v_1$ represents $\{0, 2, 3, 5, 8, 10\}$, which is a translation of both subsets represented by $(2, v_1)$ and $(14, v_1)$; and $v_2$ represents $\{0, 2\}$, which is a translation of the subset represented by $(5, v_2)$. Likewise, each element (i, u) with variable label u in each G(v) also represents a subset of the set represented by v. For example, the element $(8, v_2)$ in $G(v_1)$ represents $\{8, 10\}$. The directionless grammar G reveals that $S^*$ contains a repeated subset of size 6, which repeats itself twice as $(2, v_1)$ and $(14, v_1)$.

It may be appreciated that there are stark differences between the context free gramar discussed earlier above, and the directionless grammar presented herein. In an admissible directionless grammar G, each G(v) is a labeled set and hence directionless. Permuting elements in each G(v) does not change either G or the set $S^*$ represented by G. It is the lack of direction that gives flexibility and room to discover and represent patterns within a set. It may be noted that the set $S^*$ represented by the directionless grammar G in Example 4 is actually the set of positions of bit 1 in the sequence x represented by the context free grammar in Example 1. As such, Examples 4 and 1 deal with essentially the same object. However, the pattern revealed by the directionless grammar G in Example 4—the subsets represented by $(2, v_1)$ and $(14, v_1)$ are a repetition of each other—can not be discovered through context free grammars due to their requirement on direction.

The size of an admissible directionless grammar with variable set V may be defined as:

$$|G|=\Sigma_{v \in V}|G(v)| \quad (7)$$

For each $v \in V$, define its size $|v|$ as the cardinality of the set represented by v. For example, for the admissible directionless grammar G in Example 4, $|G|=8$, and $|v_1|=6$.

Figure 3:
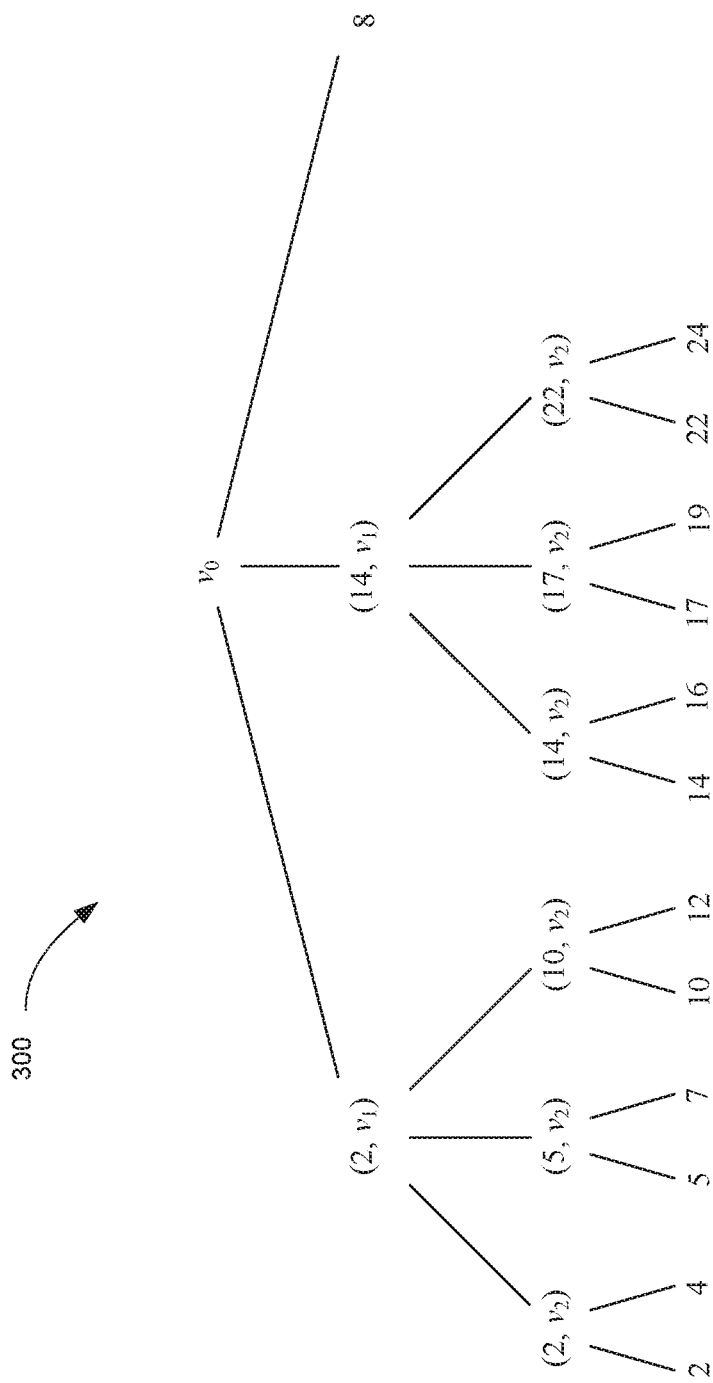
FIG. 3 shows an example derivation tree of a directionless grammar.

Reference is now made to FIG. 3, which shows an example derivation tree 300 of a directionless grammar G. In this illustration, the directionless grammar G is the example directionless grammar from Example 4, described above. More generally, $\{(S_j, L_j)\}_{j=0}^d$ may be defined as the sequence of derived labeled sets obtained during the repeated parallel expansion processes of G, where $(S_0, L_0)=G(v_0)$ and $(S_d, L_d)=(S^*, L_\omega)$. The repeated parallel expansion processes may be associated with, or described by, a tree called the derivation tree 300 of G, the root of which is labeled with $v_0$ and other nodes of which correspond one to one to elements of the following unlabeled set $$\mathcal{G} = \cup_{j=0}^d \{(i, L_j(i)): i \in S_j\} \quad (8)$$

and are labeled with the corresponding elements in the unlabeled set $\mathcal{G}$, respectively. A node other than the root is an internal node if and only if its label contains a variable. One node is a child of another node if the label of the former is obtained by expanding the label of the latter in the repeated parallel expansion processes. All nodes with labels from $(S_0, L_0)$ are the children of the root. It will be appreciated that the depth of the derivation tree 300 of G is d, and the number of internal nodes is less than or equal to $|S^*|-1$. The terminal symbol σ has been omitted from the labels of the external nodes of the tree 300 for readability.

In the examples herein, when referring to directionless grammars, for the purposes of the present application the directionless grammars represent sets $S^* \subset N$ containing no negative integers.

A directionless grammar may be said to be "localized" if:

P9. each variable $v \in V$ other than $v_0$ appears at least twice in the right members of G, i.e., in $\{G(u):u \in V\}$;

P10. each variable $v \in V$ represents a distinct set up to translation, i.e., the set represented by one variable can not be a translation of the set represented by another variable; and P11. for each $v \in V$ and any two elements $(i, u_1)$, $(j, u_2) \in G(v)$, where $u_1$ and $u_2$ are variables, if $i<j$, then the largest integer in the subset represented by $(i, u_1)$ is less than the smallest integer in the subset represented by $(j, u_2)$.

It will be understood that P9 is equivalent to that each variable $v \in V$ other than $v_0$ appears at least twice in $\mathcal{G}$ and hence in the derivation tree of G.

A directionless grammar may be said to be "regular" if in addition to P9 and P10, the following property also holds:

P12. for each $v \in V$ and any element $(i, u) \in G(v)$, where u is a variable, the subset represented by $(i, u)$ is consecutive within the set represented by v.

By mathematical induction, it may be noted that P12 is equivalent to that for any element $(i, u) \in \mathcal{G}$, where u is a variable, the subset represented by $(i, u)$ is consecutive within the set $S^*$ represented by G. In addition, since there is no collision during the whole parallel expansion processes, it follows that if G is regular, then it is also localized.

In general, $S_1$ is said to be "consecutive" within S if $S_1 = [i_{min}(S_1); i_{max}(S_1)] \cap S$, wherein:

$$i_{min}(S_1) = \min\{i:i \in S_1\}$$

and $$i_{max}(S_1) = \max\{i:i \in S_1\}$$

A directionless grammar may be said to be an "irreducible" grammar, if there is no labeled set with cardinality ≥2 that would repeat itself at least twice as consecutive subsets of either one G(v) or multiple G(v) in a disjoint manner.

Directionless Grammar Transforms

As described above, a grammar-based dimension encoder transforms a sparse signal x into an admissible directionless grammar G representing P(x). This is specifically done through the directionless grammar transform 210 (FIG. 2). That grammar G is then encoded as the vector r(G). Below are described one or more possible directionless grammar transforms.

Figure 4:
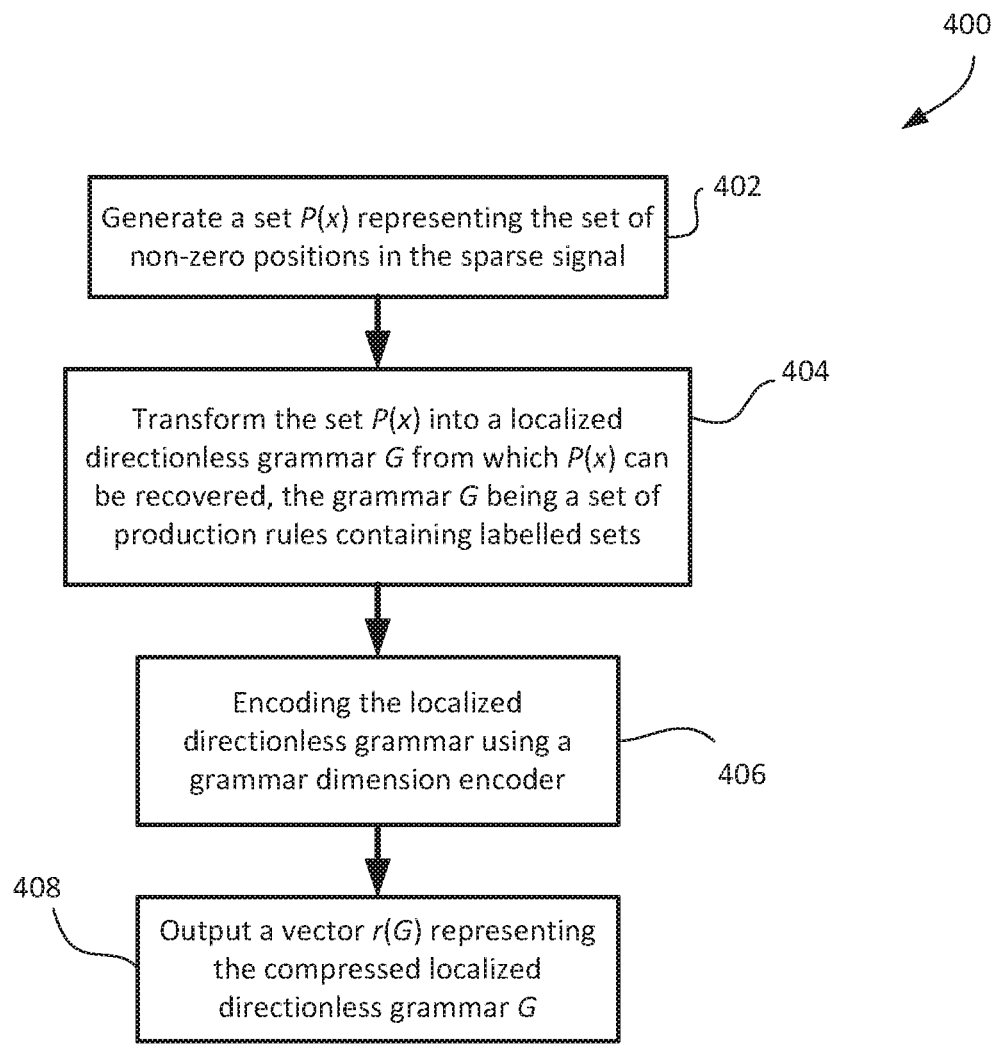
FIG. 4 shows, in flowchart form, one example method for encoding a sparse signal x using a dimension encoder.

Reference is now made to FIG. 4, which shows, in flowchart form, one example method 400 for encoding a sparse signal x using a dimension encoder. This method 400, at a simplified level, involves transforming x into an admissible directionless grammar g and encoding the grammar G in a grammar dimension encoder to produce the vector r(G). It will be appreciated that the encoding of x further includes encoding the non-zero values of the sparse signal x in, for example, the conditional non-zero encoder 230 to produce r(x|G), but for ease of illustration the example method 400 shown in FIG. 4 focusses on the grammar transform and encoding.

The method 100 includes an operation 402 of representing the set of non-zero positions in the sparse signal x as a set P(x). Recall that:

$$P(x) = \{l : x(l) \neq 0, 0 \leq l \leq n-1\}$$

The method 100 then includes transforming the set P(x) into a localized directionless grammar G. The localized directionless grammar G is defined by a set of production rules, each of which contains two or more labelled sets. The labelled sets are initialized based on the position values of the set P(x) but disjoint repeated subsets of the labelled sets are identified and additional production rules each associated with a respective variable are generated to represent the repeated subsets. Accordingly, some of the labelled sets in the production contain a variable rather than a terminal symbol, and each variable is associated with one of the production rules.

The grammar G is then encoded in a dimension encoder in operation 406 and the encoded grammar, as represented by the vector r(G) is output in operation 408.

The following section focusses upon the transform process of generating the grammar G for the sparse signal x, as indicated by operation 404.

In broad terms, the directionless grammar transform starts with a trivial admissible grammar having the following single production rule:

$$v_0 \rightarrow (P(x), L_o)$$

The transform then involves finding disjoint repeated subsets of $(P(x), L_o)$ with cardinality ≥2, and simultaneously subtracting them from $(P(x), L_o)$ with trace at the least position of elements in these subsets. This produces a new admissible grammar with two production rules $\{v_0 \rightarrow G(v_0); v_1 \rightarrow G(v_1)\}$. The process is repeated: find disjoint repeated subsets with cardinality ≥2 which occur either within one G(v), or in both $G(v_0)$ and $G(v_1)$, and simultaneously subtract them from those G(v) where the subsets occur, with trace at the least position of elements in these subsets. This results in a further revised grammar again. This process continues for each newly derived grammar until certain conditions are met. The mapping from x to the grammar $G_x$ derived at the end of the processes is an admissible grammar transform. Since there are many ways via which repeated subsets can be found, there are many different grammar transforms. One example presented below may be termed an "incremental directionless grammar transform" (IDGT). Another that will be briefly discussed thereafter may be termed aan "irreducible directionless grammar transform".

Incremental Directionless Grammar Transforms

The IDGT is one example implementation of a directionless grammar transform. The present application is not necessarily limited to IDGT implementations of the grammar transform. In general, the IDGT begins by arranging P(x) as a labelled set in order of increasing positions, and then incrementally partitioning that labelled set into disjoint subsets such that each disjoint subset with its largest element deleted is the largest prefix subset of a set of previously unpartitioned elements that is equal to, up to translation, one of the early partitioned subset. Use variables to represent the disjoint subsets, wherein subsets represented by distinct variables are distinct up to translation. The result is the directionless grammar G representing the sparse signal x.

To illustrate the process mathematically, consider x, and start with the trivial grammar $$v_0 \rightarrow (P(x), L_o) \qquad (9)$$

Arrange elements $(i, L_o(i))$ in $(P(x), L_o)$ in the increasing order of positions i:

$$(P(x), L_o) = \{(i_j, L_o(i_j))\}_{j=1}^{w(x)} \text{ where}$$
$$i_1 < i_2 < \ldots < i_{w(x)}$$

Partition $(P(x), L_\sigma)$ sequentially, in the increasing order of positions i, into disjoint (nonempty) subsets $S_1, S_2, \ldots, S_t$ such that
(a) $S_1 = \{(i_1, L_\sigma(i_1))\}$, and
(b) for $k > 1$, $$S_k = \{(i_j, L_\sigma(i_j))\}_{j=j(k)}^l \text{ where } j(k) = 1 + \sum_{f=1}^{k-1} |S_f| \quad (10)$$

and l is the smallest integer such that translations of $\{(i_j, L_\sigma(i_j))\}_{j=j(k)}^l$ have not appeared in $S_1, S_2, \ldots, S_{k-1}$ if such an integer exists, and equal to $w(x)$ otherwise.

The above partition is incremental and hence referred to as the incremental partition. The incremental partition has the following properties:

P13. All subsets $S_1, S_2, \ldots, S_t$ except, possibly, $S_t$, are distinct up to translation.

P14. Each distinct (up to translation) subset $S_k = \{(i_j, L_\sigma(i_j))\}_{j=j(k)}^l$ in $\{S_1, S_2, \ldots, S_t\}$ with $|S_k| \geq 3$ is equal to the union of a translation of $S_i$ and $\{(i_l, L_\sigma(i_l))\}$ for some $i < k$.

The production rule in (9), above, may then be rewritten as $$v_0 \to \{S_1, S_2, \ldots, S_t\} \quad (11)$$

For $1 \leq k \leq t$, let $p_k$ be the smallest position in $S_k$; let $v(S_k)$ be $\sigma$ if $|S_k| = 1$ and $$\{i_j - i_{j(k)}, L_\sigma(i_j))\}_{j=j(k)}^l$$

if $S_k = \{i_j, L_\sigma(i_j))\}_{j=j(k)}^l$ with $|S_k| \geq 2$. Clearly, $S_k$ is now uniquely represented by $(p_k, v(S_k))$. Replacing $S_k$ in (11) by $(p_k, v(S_k))$ yields $$v_0 \to \{(p_1, v(S_1)), (p_2, v(S_2)), \ldots, (p_t, v(S_t))\} \quad (12)$$

Then, $\{v(S_k): |S_k| \geq 2, 2 \leq k \leq t\}$ may be considered a variable set, and $v(S_k)$ may be defined as:

$$v(S_k) \to \{(i_j - i_{j(k)}, L_\sigma(i_j))\}_{j=j(k)}^l \quad (13)$$

if $|S_k| = 2$, and as $$v(S_k) \to \{(0, v((S_i)), (i_l - i_{j(k)}, L_\sigma(i_l))\} \quad (14)$$

if $|S_k| \geq 3$ and $S_k$ is equal to the union of a translation of $S_i$ and $\{(i_l, L_\sigma(i_l))\}$ for some $i < k$ (due to Property P14). Then the production rules identified above as (12) to (14) define a directionless grammar $\hat{G}$ representing $P(x)$. The revised grammar $\hat{G}$ may then be "pruned" so that every variable other than $v_0$ appears at least twice on the right hand of the production rules. The resulting directionless grammar again represents $P(x)$ and is denoted by $G_x$. The mapping from x to $G_x$ is referred to as the incremental directionless grammar transform.

The IDGT may be further illustrated by way of an example, Example 7, in which the sparse signal x has non-zero positions identifiable as:

$$P(x) = \{3, 5, 7, 10, 13, 15, 17, 20, 24, 27, 31, 33\}$$

Applying the incremental partition to $(P(x), L_\sigma)$ yields $$S_1 = \{(3, \sigma)\}, S_2 = \{(5, \sigma), (7, \sigma)\}, S_3 = \{(10, \sigma), (13, \sigma)\}$$

and $$S_4 = \{(15, \sigma), (17, \sigma), (20, \sigma)\}, S_5 = \{(24, \sigma), (27, \sigma), (31, \sigma)\}, S_6 = \{(33, \sigma)\}$$

Except for the last subset $S_6$, $S_1, S_2, \ldots, S_5$ are all distinct up to translation. Likewise, Property P14 is also valid: $S_4$ is the union of a translation of $S_2$ with $\{(20, \sigma)\}$, and $S_5$ is the union of a translation of $S_3$ with $\{(31, \sigma)\}$. The directionless grammar $\hat{G}$ is given by $$v_0 \to \{(3, \sigma), (5, v_1), (10, v_2), (15, v_3), (24, v_4), (33, \sigma)\}$$

$$v_1 \to \{(0, \sigma), (2, \sigma)\}$$

$$v_2 \to \{(0, \sigma), (3, \sigma)\}$$

$$v_3 \to \{(0, v_1), (5, \sigma)\}$$

$$v_4 \to \{(0, v_2), (7, \sigma)\}$$

Note that $v_3$ and $v_4$ appear only once on the right hand of $\hat{G}$. Punning $\hat{G}$ yields $$v_0 \to \{(3, \sigma), (5, v_1), (10, v_2), (15, v_1), (20, \sigma), (24, v_2), (31, \sigma), (33, \sigma)\}$$

$$v_1 \to \{(0, \sigma), (2, \sigma)\}$$

$$v_2 \to \{(0, \sigma), (3, \sigma)\}$$

The pruned $\hat{G}$ may be further converted into its "canonical" form (as will be explained furhter below), so as to obtain the grammar $G_x$ resulting from applying IDGT to x:

$$v_0 \to \{(3, \sigma), (5, v_4), (10, v_2), (15, v_4), (20, \sigma), (24, v_2), (31, \sigma), (33, \sigma)\}$$

$$v_2 \to \{(0, \sigma), (3, \sigma)\}$$

$$v_4 \to \{(0, \sigma), (2, \sigma)\}$$

As mentioned above, once a revised grammar has been obtained, it may be further modified to put it in its "canonical" form. This optional adjustment to the grammar may facilitate more efficient encoding of the grammar. In short, an admissible grammar is said to be "canonical" if:

(1) the variable set of G is $V = \{v_0, v_2, \ldots, v_{2i}\} \cup \{v_1, v_3, \ldots, v_{2(j-1)+1}\}$ for some $i \geq 0$ and $j \geq 0$, where $j = 0$ implies that the corresponding set is empty;

(2) for each variable $v \in V$, elements in $G(v)$ do not contain any negative position; and (3) for each variable $v_{2t}$, $1 \leq t \leq i$, $G(v_{2t})$ is of length 2 and the label corresponding to the positive position is the terminal symbol; conversely, if the right member $G(v)$ of a production rule $v \to G(v)$ is of length 2 and the label corresponding to the positive position is the terminal symbol, then v must be from $\{v_2, \ldots, v_{2i}\}$.

To illustrate by example, Example 8, consider the following grammar $\hat{G}_0$:

$$v_0 \to \{(3, \sigma), (5, v_4), (59, v_1), (89, v_4), (149, v_5), (189, v_5), (239, \sigma)\}$$

$$v_1 \to \{(0, v_2), (7, \sigma), (11, v_3), (12, \sigma), (18, v_2)\}$$

$$v_2 \to \{(0, \sigma), (5, v_3)\}$$

$$v_3 \to \{(0, \sigma), (4, \sigma)\}$$

$$v_4 \to \{(0, \sigma), (6, \sigma), (7, v_1), (40, v_2)\}$$

$$v_5 \to \{(0, v_1), (30, \sigma)\}$$

$\hat{G}_0$ is not canonical. Rename $v_2, v_3, v_4, v_5$ as $v_3, v_2, v_5, v_4$, respectively. Then we get a canonical grammar $G_0$:

$$v_0 \to \{(3, \sigma), (5, v_5), (59, v_1), (89, v_5), (149, v_4), (189, v_4), (239, \sigma)\}$$

$$v_1 \to \{(0, v_3), (7, \sigma), (11, v_2), (12, \sigma), (18, v_3)\}$$

$$v_2 \to \{(0, \sigma), (4, \sigma)\}$$

$$v_3 \to \{(0, \sigma), (5, v_2)\}$$

$$v_4 \to \{(0, v_1), (30, \sigma)\}$$

$$v_5 \to \{(0, \sigma), (6, \sigma), (7, v_1), (40, v_3)\}$$

Both $\hat{G}_0$ and $G_0$ represent the same set $P(x)$ given by $$P(x)=\{3\}\cup\{A_5+5\}\cup\{A_1+59\}\cup\{A_5+89\}\cup\{A_4+149\}\cup\{A_4+189\}\cup\{239\}$$

where $$A_1 = \{0, 5, 7, 9, 11, 12, 15, 18, 23, 27\}$$

$$A_4 = \{0, 5, 7, 9, 11, 12, 15, 18, 23, 27, 30\}$$

and $$A_5 = \{0, 6, 7, 12, 14, 16, 18, 19, 22, 25, 30, 34, 40, 45, 49\}$$

Note that $|P(x)|=64$.

Irreducible Directionless Grammar Transforms

Another example transform is an irreducible directionless grammar transform. The grammar in Example 7 obtained using IDGT is "regular", but is not "irreducible". To illustrated by way of further example, consider the grammar $G_x$ from Example 7. Note that with the natural order imposed on the right member of each production rule, the subsets $\{(31, \sigma), (33, \sigma)\}$ and $\{(0, \sigma), (2, \sigma)\}$ are disjoint, repeated, consecutive subsets of the right members of $G_x$—$\{(31, \sigma), (33, \sigma)\}$ is a consecutive subset of $G_x(v_0)$ and $\{(0, \sigma), (2, \sigma)\}$ is a consecutive subset of $G_x(v_4)$. Subtracting $\{(31, \sigma), (33, \sigma)\}$ from $G_x(v_0)$ with trace at 31 (or equivalently replacing $\{(31, \sigma), (33, \sigma)\}$ by $(31, v_4)$ yields $$v_0 \to \{(3, \sigma), (5, v_4), (10, v_2), (15, v_4), (20, \sigma), (24, v_2), (31, v_4)\}$$

$$v_2 \to \{(0, \sigma), (3, \sigma)\}$$

$$v_4 \to \{(0, \sigma), (2, \sigma)\}$$

The above grammar is then irreducible.

The above illustration shows that an irreducible directionless grammar transform (IRDGT) may be obtained by imposing the natural order on the right member of each production rule in a regular grammar G. In general the IRDGT process involves finding disjoint, repeated, consecutive subsets with cardinality $\geq 2$ of the right members of G. The subsets are then simultaneously subtracted from those G(v) where the subsets occur, with trace at the least position of elements in these subsets, while maintaining P9 and P10 through pruning, if necessary, (as shown in Example 7). This reults in a new grammar. The process is repeated for each newly derived grammar until no disjoint, repeated, consecutive subsets with cardinality $\geq 2$ can be found from the right members of the newly derived grammar. The mapping from x to the grammar $G_x$ derived at the end of the processes (in its canonical form) is then an IRDGT. Due to a variety of ways via which disjoint, repeated, consecutive subsets with cardinality $\geq 2$ can be found from the right members of a regular grammar, there are many different IRDGTs.

Another example of an irreducible grammar derived from the grammar produced in Example 7 is below:

$$v_0 \to \{(3, v_1), (13, v_1), (24, v_4), (31, v_2)\}$$

$$v_1 \to \{(0, v_2), (4, v_4)\}$$

$$v_2 \to \{(0, \sigma), (2, \sigma)\}$$

$$v_4 \to \{(0, \sigma), (3, \sigma)\}$$

Other examples will be appreciated in light of the above discussion.

Dimension Encoding of Grammars and Signals

As noted above, having obtained a grammar G through the directionless grammar transform of x, the grammar G is then to be compressed using the grammar dimension encoder 220 (FIG. 2). Two example types of grammar dimension encoders are described below. However, before describing the encoders, for the purpose of explaining the processes it is useful to note that the structure s(x) of x may be separate from its contents. The structure s(x) may be considered a significant map indicated the positions of zero values and non-zero values in x. It may be defined as:

$$s(x)=[s(x(0)), s(x(1)), \ldots, s(x(n-1))]$$

with $$s(x(i)) = \begin{cases} 0 & \text{if } x(i) = 0 \\ 1 & \text{otherwise} \end{cases}.$$

for any $0 \leq i \leq n-1$. Given n, it is clear that s(x) and P(x) determine each other. As such, dimensionally encoding s(x) can be carried out by dimensionally encoding G representing P(x).

Grammar Dimension Encoder Type I

A Type I grammar dimension encoder takes a canonical grammar G as an input and produces two output vectors $r_1^s(G)$ and $r_2^s(G)$. The process for producing the two output vectors generally involves four operations.

Figure 5:
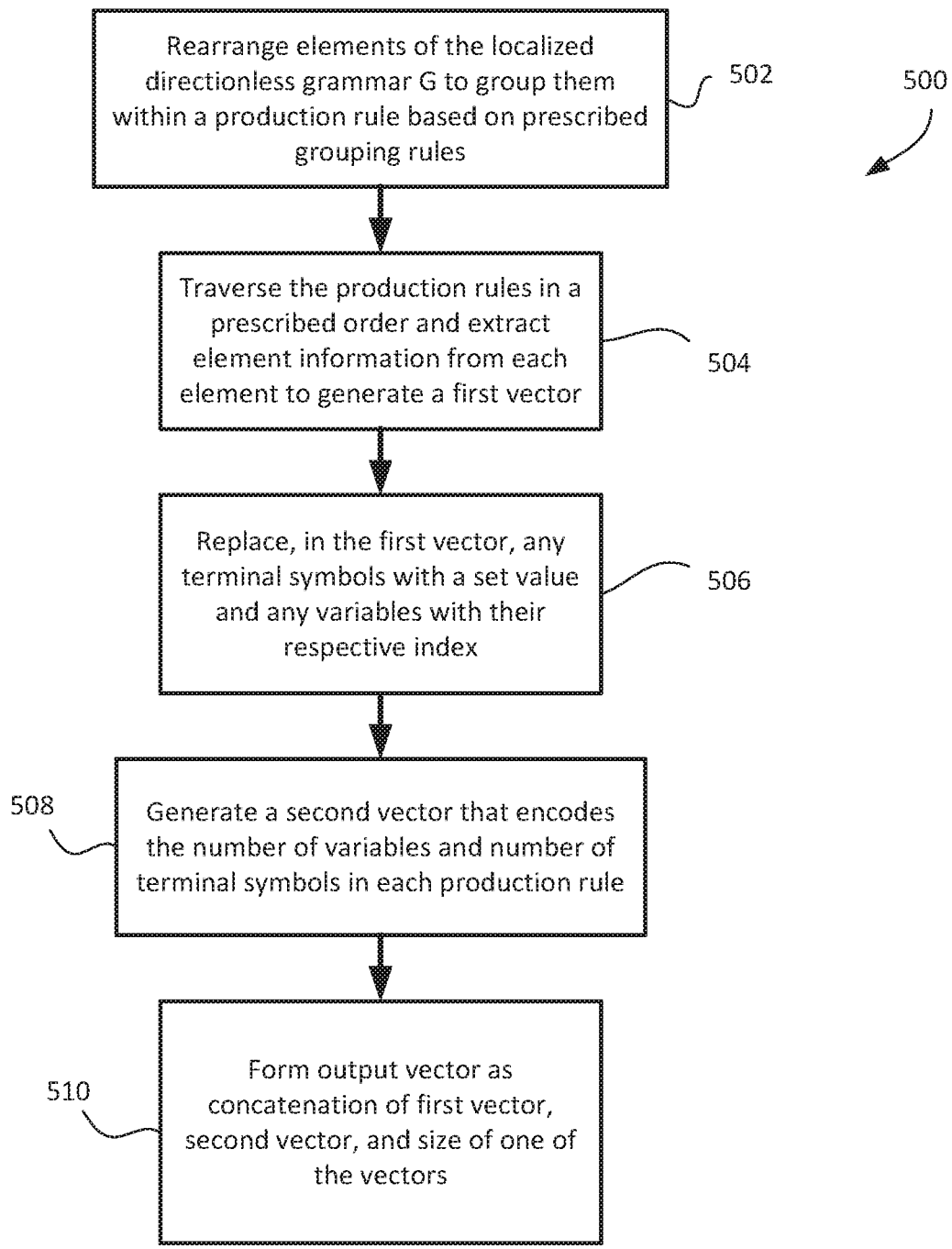
FIG. 5 shows, in flowchart form, one example method of encoding a directionless grammar.

Reference is now made to FIG. 5, which shows, in flowchart form, one example method 500 of encoding a directionless grammar G. The method 500 begins with an operation 502 of rearranging the elements of the grammar G. In particular, the elements are rearranged to group elements in a production rule based on whether they contain a terminal symbol or a variable using a prescribed set of grouping rules.

As an example, consider a canonical grammar G. For each $v \in V$, re-arrange elements in G (v) in the following manner:

(1) if $v=v_0$, elements in $G(v_0)$ containing variables are first sorted in the increasing order of their positions, and then followed by elements containing the terminal symbol sorted again in the increasing order of their respective positions;

(2) if $v \in \{v_2, \ldots, v_{2i}\}$, elements in G(v) are sorted in the increasing order of their positions;

(3) if $v \in \{v_1, v_3, \ldots, v_{2(j-1)+1}\}$ and the label corresponding to the zero position in G(v) is a variable, elements in G(v) containing variables are first sorted in the increasing order of their positions, and then followed by elements containing the terminal symbol sorted again in the increasing order of their respective positions; and (4) if $v \in \{v_1, v_3, \ldots, v_{2(j-1)+1}\}$ and the label corresponding to the zero position in G(v) is the terminal symbol, elements in G(v) containing the terminal symbol are first sorted in the increasing order of their positions, and then followed by elements containing a variable sorted again in the increasing order of their respective positions.

The re-arranged G is identical to the original. Endowed with the above order, each G(v) is then an ordered labeled set. To emphasize this order, the rearranged grammar may be referred to as [G(v)] in place of G(v).

This rearranging operation may be further illustrated by way of Example 9. Consider the canonical grammar $G_0$ obtained in Example 8, above. Applying the above set of grouping rules, operation 502 would yield the following rearranged grammar:

$v_0 \rightarrow \{(5, v_5), (59, v_1), (89, v_5), (149, v_4), (189, v_4),$
$\quad (3, \sigma), (239, \sigma)\}$ $v_1 \rightarrow \{(0, v_3), (11, v_2), (18, v_3), (7, \sigma), (12, \sigma)\}$ $v_2 \rightarrow \{(0, \sigma), (4, \sigma)\}$ $v_3 \rightarrow \{(0, \sigma), (5, v_2)\}$ $v_4 \rightarrow \{(0, v_1), (30, \sigma)\}$ $v_5 \rightarrow \{(0, \sigma), (6, \sigma), (7, v_1), (40, v_3)\}$ The process 500 then includes operation 504 in which the production rules of the rearranged grammar are traversed element-by-element in a prescribed order and element information is extracted and recorded to build a vector $\hat{r}_1^s(G)$. The element information extracted is partly depenent upon the nature of the element. In particular, it is dependent on whether it is the first production rule, whether it is the first element of a production rule, and whether it contains a terminal symbol or a variable.

In the present example the prescribed order is:

$[G(v_0)][G(v_2)] \ldots [G(v_{2i})][G(v_1)][G(v_3)] \ldots$
$\quad [G(v_{2(j-1)+1})]$ That is, the presecribed order is (a) the first production rule followed by (b) every other production rule in increasing order, and followed by (c) each production rule skipped over in (b) in increasing order.

The element information to be extracted and recorded as the vector may be defined as:

(1) if the element is in $[G(v_0)]$, its element information is both its position and variable if that element contains a variable, and only its position if that element contains the terminal symbol;

(2) if the element is the first element in $[G(v)]$, $v \neq v_0$, its element information is its variable or terminal symbol (as the case may be), i.e., its label; and (3) if the element is in $[G(v)]$, $v \neq v_0$, but not the first element of $[G(v)]$, its element information is both its position and variable if that element contains a variable, and only its position if that element contains the terminal symbol.

The result of extracting the element information, so defined, in the prescribed order is the vector $\hat{r}_1^s(G)$.

As an illustrative example, consider applying the operation 504 to the rearranged grammar described above. The resulting vector $\hat{r}_1^s(G)$ is given by:

$\hat{r}_1^s(G_0)=[5, v_5, 59, v_1, 89, v_5, 149, v_4, 189, v_4, 3,$
$\quad 239, \sigma, 4, v_1, 30, v_3, 11, v_2, 18, v_3, 7, 12, \sigma, 5,$
$\quad v_2, \sigma, 6, 7, v_1, 40, v_3]$ The output vector vector $\hat{r}_1^s(G)$ is then converted to a desired first output vector in operation 506 by replacing each terminal symbol by 0 and each variable $v_t$ by the index of the variable, t. Applying this operation to the example vector above gives:

$r_1^s(G_0)=[5, 5, 59, 1, 89, 5, 149, 4, 189, 4, 3, 239, 0,$
$\quad 4, 1, 30, 3, 11, 2, 18, 3, 7, 12, 0, 5, 2, 0, 6, 7,$
$\quad 1, 40, 3]$ Then, in operation 508, a second output vector is constructed that effectively encodes the number of variables and terminal symbols in respective production rules in the directionless grammar G. In one example, this encoding includes, for each variable v, defining $|G(v)|_0$ and $|G(v)|_1$ to denote, respectively, the number of elements in $G(v)$ which contain the terminal symbol $\sigma$, and the number of elements in $G(v)$ which contain a variable. For each $1 \leq s \leq j$, let $I(G(v_{2(t-1)+1}))$ be 1 if the first element in $G(v_{2(t-1)+1})$ contains a variable;

and 0 otherwise. The desired second output vector $r_2^s(G) = [r_2^s(0), r_2^s(1), r_2^s(2), \ldots, r_2^s(2j+2)]$ is constructed recursively as follows:

$$r_2^s(0) = 2|G(v_0)|_1 \tag{15}$$

$$r_2^s(1) = r_2^s(0) + |G(v_0)|_0 \tag{16}$$

$$r_2^s(2) = r_2^s(1) + 2i \tag{17}$$

and for $$t = 1, 2, \ldots, j, \tag{18}$$

$r_2^s(2(t-1)+3) =$ $r_2^s(2(t-1)+2) + \begin{cases} 2|G(v_{2(t-1)+1})|_1 - 1 & \text{if } I(G(v_{2(t-1)+1})) = 1 \\ |G(v_{2(t-1)+1})|_0 & \text{otherwise} \end{cases}$ and $$r_2^s(2(t-1)+4) = \tag{19}$$

$r_2^s(2(t-1)+3) + \begin{cases} |G(v_{2(t-1)+1})|_0 & \text{if } I(G(v_{2(t-1)+1})) = 1 \\ 2|G(v_{2(t-1)+1})|_1 & \text{otherwise} \end{cases}.$ In this manner, the second output vector $r_2^s(G)$ is produced.

This process may be illustrated through applying the above operations to the example grammar $G_0$ referenced earlier to yield:

$r_2^s(G_0)=[10, 12, 16, 21, 23, 24, 26, 28, 32]$

Having obtained the first and second output vectors, they may be concatenated, together with a size value for one of the vecors, to generate a final output vector, $r^s(G)=[|r_2^s(G)|, r_2^s(G), r_1^s(G)]$, as indicated by operation 510. The mapping $G \rightarrow r^s(G)$ resprests the grammar dimension encoder of Type I.

It can be shown that under some mild conditions on G, $r^s(G)$ indeed provides a compressed dimension representation of $s(x)$. If $x \rightarrow G_x$ is a grammar transform, then the mapping $x \rightarrow r^s(G_x)$ may be referred to as a directionless grammar-based dimension encoder of type I with the underlying grammar transform $x \rightarrow G_x$.

To further characterize the encoder, consider $$V_o(G) = \{v_1, v_3, \ldots, v_{2(j-1)+1}\} \tag{20}$$

$$N(G) = |G(v_0)|_1 + \sum_{t=1}^{j} |G(v_{2(t-1)+1})|_1 \text{ and} \tag{21}$$

$$I(G) = |\{v \in V_0(G) : I(G(v)) = 0\}| \tag{22}$$

where the variable set of G is $V=\{v_0, v_2, \ldots, v_{2i}\} \cup \{v_1, v_3, \ldots, v_{2(j-1)+1}\}$. Note that $N(G)$ is simply the number of variables appearing in $G(v_0)$ and $G(v_{2(t-1)+1})$, $1 \leq t \leq j$, and $I(G)$ is the number of variables $v_{2(t-1)+1}$ for which the label corresponding to the zero position in $G(v_{2(t-1)+1})$ is the terminal symbol.

It may therefore be stated that the grammar dimension encoder of Type I using the method 500 described above has the following properties:

(1) The mapping $G \to r^s(G)$ is one to one, and the set $\{r^s(G):G \text{ is canonical}\}$ is a prefix set.
(2) The number of dimensions of $r^s(G)$ is equal to $$|r^s(G)| = 1 + |r_1^s(G)| + |r_2^s(G)| = 4 + |G| + |V_0(G)| + N(G) + I(G) \quad (23)$$

$$\leq 4 + |G| + 2|V_0(G)| + N(G) \quad (24)$$

Furthermore, if G represents P(x) or equivalently s(x) and every variable in G other than $v_0$ appears at least twice in the right members of G, then $|G| \leq w(x)$ (3) There is an algorithm which, in response to the input $r^s(G)$, outputs the set $S^* \subset N$ represented by G in $O(|S^*|)$ time.

Grammar Dimension Encoder Type II

Given x, let G be a canonical directionless grammar representing P(x). Let the variable set of G be $V = \{v_0, v_2, \ldots, v_{2i}\} \cup \{v_1, v_3, \ldots, v_{2(j-1)+1}\}$. In the example process described below, a grammar dimension encoder of Type II may be used to encode both G and x into three vectors $r_1(G)$, $r_2(G)$, and $r_3(x|G)$, all from $R_n$. Recall that for each variable $v \in V$, its size $|v|$ is the cardinality of the set represented by v.

Figure 6:
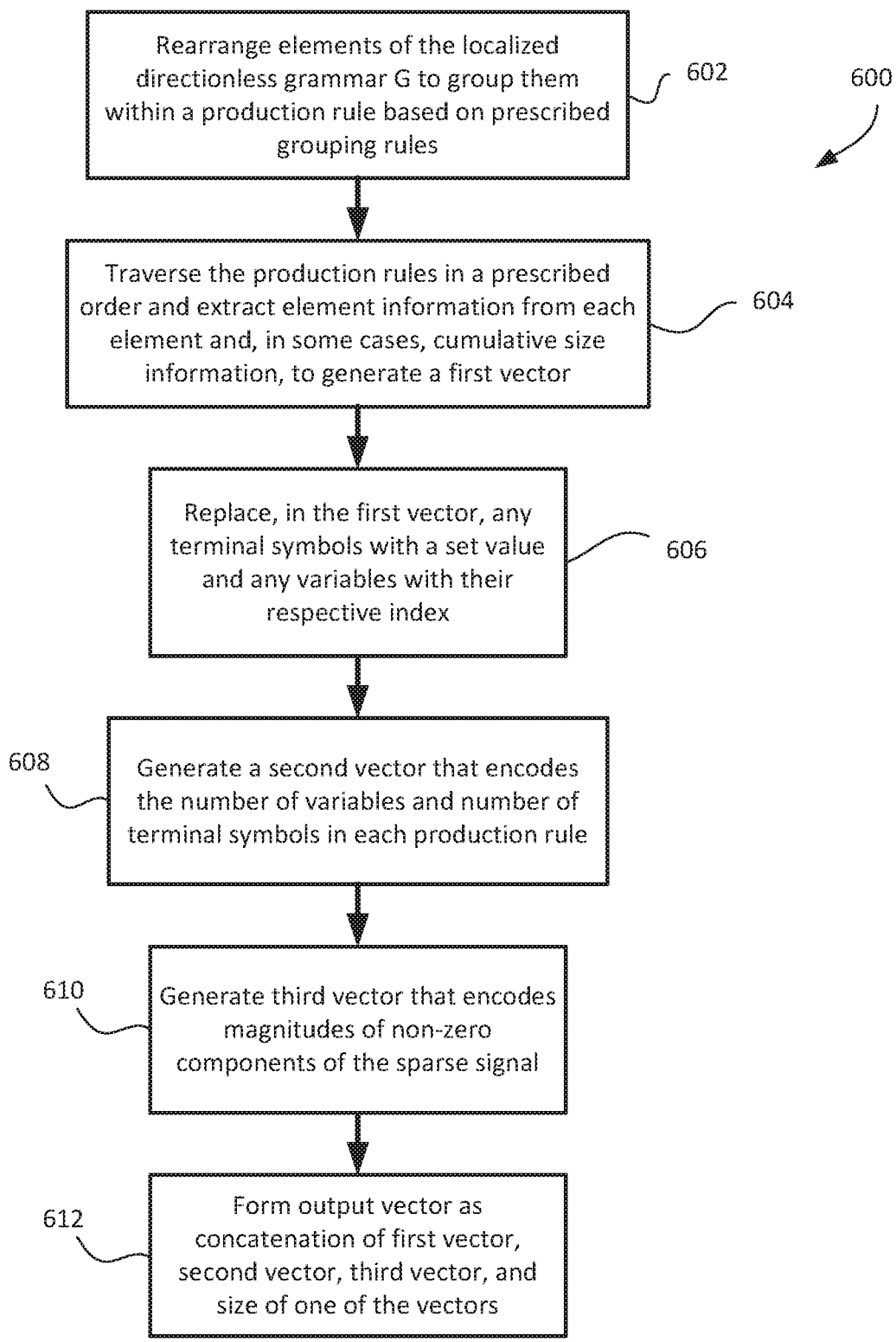
FIG. 6 shows, in flowchart form, another example method of encoding a sparse signal x using a Type II grammar dimension encoder.

Reference is now made to FIG. 6, which shows an example process 600 for encoding a sparse signal x using a Type II grammar dimension encoder. Operation 602 of the process is the same as operation 502 (FIG. 5) of the process 500 (FIG. 5) described above.

Operation 604 is similar to operation 504 (FIG. 5), but involves recording more information for each element in G whenever specified conditions are met. As before, the elements of the production rules of the rearranged grammar are traversed element-by-element to record element information. Also recorded is cumulative information on sizes of variables (if applicable) in the following manner:

(1) if the element is in $[G(v_0)]$ and contains a variable, record its position, its variable, and its cumulative size value equal to the sum of sizes of all variables appearing in $[G(v_0)]$ up to that element inclusive;
(2) if the element is in $[G(v_0)]$, but does not contain a variable, record only its position;
(3) if the element is in $[G(v_{2t})]$, $1 \leq t \leq i$, record its variable or terminal symbol (as the case may be) if that element is the first element in $[G(v_{2t})]$, and its position otherwise;
(4) if the element is the first element in $[G(v_{2(t-1)+1})]$, $1 \leq t \leq j$, record its variable and its cumulative size value equal to the size of its variable if that element contains a variable, and the terminal symbol otherwise;
(5) if the element is not the first element in $[G(v_{2(t-1)+1})]$, $1 \leq t \leq j$, but contains a variable, record its position, its variable, and its cumulative size value equal to the sum of sizes of all variables appearing in $[G(v_{2(t-1)+1})]$ up to that element inclusive; and
(6) if the element is not the first element in $[G(v_{2(t-1)+1})]$, $1 \leq t \leq j$, and does not contain a variable either, record its position only.

Denote the resulting vector by $\hat{r}_1(G)$.

This operation 604 may be further illustrated by way of example with reference to the rearranged grammar $G_0$ used in the above examples. That rearranged grammar $G_0$ was given by the following production rules:

$v_0 \to \{(5, v_5), (59, v_1), (89, v_5), (149, v_4), (189, v_4), (3, \sigma), (239, \sigma)\}$ $v_1 \to \{(0, v_3), (11, v_2), (18, v_3), (7, \sigma), (12, \sigma)\}$ $v_2 \to \{(0, \sigma), (4, \sigma)\}$ $v_3 \to \{(0, \sigma), (5, v_2)\}$ $v_4 \to \{(0, v_1), (30, \sigma)\}$ $v_5 \to \{(0, \sigma), (6, \sigma), (7, v_1), (40, v_3)\}$ If the steps of the above operation 604 are applied to this rearranged grammar, the resulting first vector is given by:

$\hat{r}_1(G_0) = [5, v_5, 15, 59, v_1, 25, 89, v_5, 40, 149, v_4, 51,$
$189, v_4, 62, 3, 239, \sigma, 4, v_1, 30, v_3, 3, 11, v_2, 5,$
$18, v_3, 8, 7, 12, \sigma, 5, v_2, 2, \sigma, 6, 7, v_1, 10, 40,$
$v_3, 13]$ Operation 606 is similar to operation 506 (FIG. 5), in that it involves modifying the first vector replacing the terminal symbol by 0 and replacing each variable $v_t$ by its index, t, to obtain the first output vector $r_1(G)$. Applying that process to the example first vector above gives:

$r_1(G_0) = [5, 5, 15, 59, 1, 25, 89, 5, 40, 149, 4, 51,$
$189, 4, 62, 3, 239, 0, 4, 1, 30, 3, 3, 11, 2, 5,$
$18, 3, 8, 7, 12, 0, 5, 2, 2, 0, 6, 7, 1, 10, 40, 3,$
$13]$

In operation 608, the second vector $r_2(G)$ is constructed. The second vector $r_2(G)$ has the same number of dimensions as does $r_2^s(G)$, which was the second vector produced in the process 500, above. In a process similar to the steps (15) to (19) desribed above, $r_2(G) = [r_2(0), r_2(1), r_2(2), \ldots, r_2(2j+2)]$ is constructed recursively as follows:

$$r_2(0) = 3|G(v_0)|_1 \quad (25)$$

$$r_2(1) = r_2(0) + |G(v_0)|_0 \quad (26)$$

$$r_2(2) = r_2(1) + 2i \quad (27)$$

and for $$t = 1, 2, \ldots, j, \quad (28)$$

$$r_2(2(t-1)+3) = r_2(2(t-1)+2) + \begin{cases} 3|G(v_{2(t-1)+1})|_1 - 1 & \text{if } I(G(v_{2(t-1)+1})) = 1 \\ |G(v_{2(t-1)+1})|_0 & \text{otherwise} \end{cases}$$

and $$r_2(2(t-1)+4) = \quad (29)$$
$$r_2(2(t-1)+3) + \begin{cases} |G(v_{2(t-1)+1})|_0 & \text{if } I(G(v_{2(t-1)+1})) = 1 \\ 3|G(v_{2(t-1)+1})|_1 & \text{otherwise} \end{cases}.$$

To illustrate operation 608 by way of example, applying the above steps to the example rearranged grammar $G_0$ gives the following second output vector:

$r_2(G_0) = [15, 17, 21, 29, 31, 32, 35, 37, 43]$

The method 600 further includes operation 610, which includes generating the third output vector $r_3(x|G)$. The third output vector $r_3(x|G)$ effectively encodes the magnitudes or values of the non-zero components of the sparse signal x. Recall that the rearranged grammar, e.g. the rearranged production rules, was designated by the symbol $[G(v_0)]$. All variables in $[G(v_0)]$ are expanded in parallel by the respective re-arranged production rules. This results in another vector and the parallel expansion process is repeated until it results in a vector which contains no variable. Strike out all terminal symbols from the vector containing no variable.

Denote the resulting vector by T(G). Then $T(G) = [i_1, i_2, \ldots, i_{w(x)}]$ is effectively a permutation of [P(x)]. It will be appreciated that:

$$x(T(G)) = [x(i_1), x(i_2), \ldots, x(i_{w(x)})]$$

In the case that $b = \lceil \log n \rceil$, the desired third vector $r_3(x|G) = [r_3(0), r_3(1), \ldots, r_3(w(x)-1)]$ is exactly equal to $x(T(G))$. When $b \neq \lceil \log n \rceil$, the desired third vector $r_3(x|G)$ can be derived as follows. Since each $x(i_j)$, $1 \leq j \leq w(x)$, is b bits long, concatenate $x(i_1), x(i_2), \ldots, x(i_{w(x)})$ in the indicated order into a sequence of $bw(x)$ bits. Divide the concatenated sequence into $$\left\lceil \frac{bw(x)}{\lceil \log n \rceil} \right\rceil$$

non-overlapping blocks, where each block is $\lceil \log n \rceil$ bits long, and the last block may contain some extra dummy zero bits to make the length of $\lceil \log n \rceil$. Then these $$\left\lceil \frac{bw(x)}{\lceil \log n \rceil} \right\rceil$$

non-overlapping blocks form the desired third vector $$r_3(x|G) = \left[ r_3(0), r_3(1), \ldots, r_3\left( \left\lceil \frac{bw(x)}{\lceil \log n \rceil} \right\rceil - 1 \right) \right]$$

with $r_3(i)$ taking the value of the ith block, $$0 \leq i \leq \left\lceil \frac{bw(x)}{\lceil \log n \rceil} \right\rceil - 1.$$

To illustrate operation 610 by way of example, consider the example rearranged grammar $G_0$ discussed above. Applying operation 610 to grammar $G_0$ means expansion that progressively results in the following sequence of vectors:

[(5, $v_5$), (59, $v_1$), (89, $v_5$), (149, $v_4$), (189, $v_4$), (3, σ), (239, σ)]

[5, 11, (12, $v_1$), (45, $v_3$), (59, $v_3$), (70, $v_2$), (77, $v_3$), 66, 71, 89, 95, (96, $v_1$), (129, $v_3$), (149, $v_1$), 179, (189, $v_1$), 219, 3, 239]

[5, 11, (12, $v_3$), (23, $v_2$), (30, $v_3$), 19, 24, 45, (50, $v_2$) 59, (64, $v_2$), 70, 74, 77, (82, $v_2$), 66, 71, 89, 95, (96, $v_3$), (107, $v_2$), (114, $v_3$), 103, 108, 129, (134, $v_2$), (149, $v_3$), (160, $v_2$), (167, $v_3$), 156, 161, 179, (189, $v_3$), (200, $v_2$), (207, $v_3$), 196, 201, 219, 3, 239,]

[5, 11, 12, (17, $v_2$), 23, 27, 30, (35, $v_2$), 19, 24, 45, 50, 54, 59, 64, 68, 70, 74, 77, 82, 86, 66, 71, 89, 95, 96, (101, $v_2$), 107, 111, 114, (119, $v_2$), 103, 108, 129, 134, 138, 149, (154, $v_2$), 160, 164, 167, (172, $v_2$), 156, 161, 179, 189, (194, $v_2$), 200, 204, 207, (212, $v_2$), 196, 201, 219, 3, 239]

[5, 11, 12, 17, 21, 23, 27, 30, 35, 39, 19, 24, 45, 50, 54, 59, 64, 68, 70, 74, 77, 82, 86, 66, 71, 89, 95, 96, 101, 105, 107, 111, 114, 119, 123, 103, 108, 129, 134, 138, 149, 154, 158, 160, 164, 167, 172, 176, 156, 161, 179, 189, 194, 198, 200, 204, 207, 212, 216, 196, 201, 219, 3, 239]

The terminal symbol has been omitted for clarity. The last vector above is $T(G_0)$. Assume $b = \lceil \log n \rceil$. The vector $r_3(x|G_0)$ is then equal to $r_3(x|G_0) = [x(5), x(11), x(12), x(17), x(21), x(23), x(27), x(30), x(35), x(39), x(19), x(24), \ldots, x(216), x(196), x(201), x(219), x(3), x(239)]$ The components of $r_3(x|G_0)$ are a permutation of nonzero components in x, where the position (or coordinate) permutation is given by $T(G_0)$.

Having obtained the three output vectors, they may be concatentated together with a size value of one of the vectors to realize a final output vector $r(x, G) = [|r_2(G)|, r_2(G), r_1(G), r_3(x|G)]$. The mapping $G \to r(G) = [|r_2(G)|, r_2(G), r_1(G)]$ may be termed a grammar dimension encoder of type II. It can be shown that under some mild conditions on G, $r(x, G)$ indeed provides a compressed dimension representation of x. If $x \to G_x$ is a grammar transform, the mapping $x \to r(x, G_x)$ may be referred to as a directionless grammar-based dimension encoder with the underlying grammar transform $x \to G_x$.

Decoding Grammar-Based Dimension Coded Data

Described below are example processes for randomly accessing components of s(x) and x through $r^s(G)$ and $r(x, G)$, respectively.

Random Access of s(x) Through $r^s(G)$

Given x, let G be a canonical localized grammar representing P(x). A recursive procedure may be applied through which $s(x(l))$, $0 \leq l \leq n-1$, can be accessed through $r^s(G)$. Since $r^s(G)$ is self-delimiting, one can determine in constant time where $r_2^s(G)$ and $r_1^s(G)$ start and end in $r^s(G)$. Therefore, in what follows, the input $r^s(G)$ would be regarded as two inputs $r_2^s(G)$ and $r_1^s(G)$.

Let $\Delta$ denote a position offset, the meaning of which will become clear below. Given $r^s(G)$ and any $0 \leq l \leq n-1$, the algorithm outputs $s(x(l))$ via the following example recursive procedure:

1. Initialize $\Delta$ to be l.
2. If $r_2^s(1) > r_2^s(0)$, use the bisection method to determine whether $\Delta$ appears in $r_1^s(k)$, $k = r_2^s(0), \ldots, r_2^s(1)-1$. If $\Delta$ appears therein, then output $s(x(l)) = 1$ and stop. If $\Delta$ does not appear therein, move to Step 3.
3. If $r_2^s(0) = 0$ or $\Delta < r_1^s(0)$, output $s(x(l)) = 0$ and stop. Otherwise, use the bisection method to determine the largest k, $1 \leq k \leq r_2^s(0)/2$, such that $r_1^s(2k-2) \leq \Delta$. If $\Delta = r_1^s(2k-2)$, then output $s(x(l)) = 1$ and stop. If $\Delta \neq r_1^s(2k-2)$, let $I = r_1^s(2k-1)$, update $\Delta$ according to $$\Delta \leftarrow \Delta - r_1^s(2k-2)$$

and then move to Step 4 if I is even, and Step 5 if I is odd.
4. If $\Delta = r_1^s(r_2^s(1)+I-1)$, output $s(x(l)) = 1$ and stop. Otherwise, check $r_1^s(r_2^s(1)+I-2)$ to see if it is zero. If yes, output $s(x(l)) = 0$ and stop. If no, update I into $I \leftarrow r_1^s(r_2^s(1)+I-2)$. Repeat this step if I is even, and move to Step 5 if I is odd.
5. Check $r_1^s(r_2^s(I+1))$ to see if it is zero. Go to Step 6 if yes, and Step 8 if no.
6. If $r_2^s(I+2) - r_2^s(I+1) = 1$, move to Step 7. Otherwise, use the bisection method to determine whether $\Delta$ appears in $r_1^s(k)$, $k = r_2^s(I+1)+1, \ldots, r_2^s(I+2)-1$. If $\Delta$ appears therein, then output $s(x(l)) = 1$ and stop. If $\Delta$ does not appear therein, move to Step 7.
7. If $r_2^s(I+3) - r_2^s(I+2) = 0$ or $\Delta < r_1^s(r_2^s(I+2))$, then output $s(x(l)) = 0$ and stop. Otherwise, use the bisection method to determine the largest k, $1 \leq k \leq (r_2^s(I+3) - r_2^s(I+2))/2$, such that $$r_1^s(r_2^s(I+2)+2k-2) \leq \Delta$$

If $\Delta=r_1^s(r_2^s(I+2)+2k-2)$, then output $s(x(l))=1$ and stop. If $\Delta\neq r_1^s(r_2^s(I+2)+2k-2)$, first update $\Delta$ as $$\Delta \leftarrow \Delta - r_1^s(r_2^s(I+2)+2k-2)$$

then update I according to $I\leftarrow r_1^s(r_2^s(I+2)+2k-1)$ and finally move to Step 4 if I is even, and Step 5 if I is odd.

8. If $r_2^s(I+3)-r_2^s(I+2)>0$, use the bisection method to determine whether $\Delta$ appears in $r_1^s(k)$, $k=r_2^s(I+2), \ldots, r_2^s(I+3)-1$. If $\Delta$ appears therein, then output $s(x(l))=1$ and stop. If $\Delta$ does not appear therein, move to Step 9.

9. Use the bisection method to determine the largest k, $1\leq k\leq (r_2^s(I+2)-r_2^s(I+1)-1)/2$, such that $$r_1^s(r_2^s(I+1)+2k-1)\leq \Delta \tag{30}$$

If such k satisfying (30) exists and $\Delta=r_1^s(r_2^s(I+1)+2k-1)$, then output $s(x(l))=1$ and stop. If such k satisfying (30) exists and $\Delta>r_1^s(r_2^s(I+1)+2k-1)$, first update $\Delta$ as follows $$\Delta \leftarrow \Delta - r_1^s(r_2^s(I+1)+2k-1) \tag{31}$$

then update I according to $$I\leftarrow r_1^s(r_2^s(I+1)+2k) \tag{32}$$

and finally go back to Step 4 if I is even, and Step 5 if I is odd. If such k satisfying (30) does not exist, update I into $I\leftarrow r_1^s(r_2^s(I+1))$; and go back to Step 4 if I is even, and Step 5 if I is odd.

The above process may be illustrated by example with reference, again, to the example vectors developed above for encoding the grammar $G_0$. Suppose, in this example, the position offset for the random access search is $\Delta=111$. The above-described process executes Step 2 and determines that $\Delta$ does not appear in $r_1^s(10)$, $r_1^s(11)$. Accordingly, it moves to Step 3. Using the bisection method, the process locates $r_1^s(4)=89$, computes $I=r_1^s(5)=5$, and updates $\Delta$ as $$\Delta \leftarrow 22=111-89$$

Since I is odd, the process moves on to Step 5. Since $r_2^s(6)=26$, it checks $r_1^s(26)$, which is 0. The process thus moves on to Step 6. Using the bisection method, the process determines that $\Delta$ does not appear in $r_1^s(27)$, and it then moves on to Step 7. Executing Step 7, the process updates I and $\Delta$, respectively, as $$I=r_1^s(29)=1$$

$$\Delta \leftarrow 15=22-r_1^s(28)$$

The newly update I is odd. Move to Step 5 again. The process checks $r_1^s(16)$, which is nonzero, and moves to Step 8. Using the bisection method, the process determines that the newly updated $\Delta$ does not appear in $r_1^s(21)$, $r_1^s(22)$, and moves on to Step 9. Using the bisection method, the process locates $r_1^s(17)=11$, and updates I and $\Delta$, respectively, as $$I=r_1^s(18)=2$$

$$\Delta \leftarrow 4=15-r_1^s(17)$$

and moves to Step 4 since the newly updated I is even. Compare the newly updated $\Delta$ with $r_1^s(13)$. Since $\Delta=r_1^s(13)$, the process outputs $s(x(111))=1$ and stops. Note that 111 is indeed in $P(x)$.

Random Access of x Through r(x, G)

Another recursive procedure may be applied through which $x(l)$, $0\leq l\leq n-1$, can be quickly accessed through $r(x, G)$. Once again, since $r(x, G)$ is self-delimiting, one can determine in constant time where $r_2(G)$, $r_1(G)$, and $r_3(x|G)$ start and end in $r(x, G)$. Therefore, in what follows, the input $r(x, G)$ would be regarded as three inputs $r_2(G)$, $r_1(G)$, and $r_3(x|G)$.

For the purposes of this explanation, imagine there is a reader scanning the vector $x(T(G))=[x(i_1), x(i_2), \ldots, x(i_{w(x)})]$ in operation 610 (FIG. 6) of method 600 (FIG. 6), from right to left. Let $\Pi$ denote the component index of the vector $x(T(G))$ that is currently being read. As before, $\Delta$ denotes the position offset. To simplify the description, assume that $b=\lceil \log n \rceil$. Given $r(x, G)$ and any $0\leq l\leq n-1$ as inputs, the algorithm outputs $x(l)$ via the following steps:

1. Compute $w(x)$ and initialize $\Delta$ and $\Pi$ to be 1 and $w(x)-1$, respectively. The computation of $w(x)$ is based on:

$$|r_1(G)|-r_2(|r_2(G)|-1)$$

and $$w(x) = \begin{cases} r_1(r_2(0)-1)+r_2(1)-r_2(0) & \text{if } r_2(0)>0 \\ r_2(1)-r_2(0) & \text{otherwise} \end{cases}.$$

2. If $r_2(1)>r_2(0)$, use the bisection method to determine whether $\Delta$ appears in $r_1(k)$, $k=r_2(0), \ldots, r_2(1)-1$. If $\Delta$ appears therein, determine the unique $1\leq t\leq r_2(1)-r_2(0)$ such that $$r_1(r_2(0)+t-1)=\Delta \tag{33}$$

then output $$x(l)=r_3(\Pi-(r_2(1)-r_2(0))+t) \tag{34}$$

and stop. If $\Delta$ does not appear therein, update $\Pi$ as follows $$\Pi \leftarrow \Pi-(r_2(1)-r_2(0)) \tag{35}$$

and then move to Step 3.

3. If $r_2(0)=0$ or $\Delta<r_1(0)$, output $x(l)=0$ and stop. Otherwise, use the bisection method to determine the largest k, $1\leq k\leq r_2(0)/3$, such that $r_1(3k-3)\leq \Delta$. If $\Delta=r_1(3k-3)$, then output $$x(l)=r_3(r_1(3k-4)) \tag{36}$$

where by convention, $r_1(-1)=0$, and stop. On the other hand, if $\Delta>r_1(3k-3)$, let $I=(3k-2)$ and update $\Delta$ and $\Pi$, respectively, as follows $$\Delta \leftarrow \Delta - r_1(3k-3) \tag{37}$$

and $$\Pi=r_1(3k-1)-1 \tag{38}$$

Then move to Step 4 if I is even, and Step 5 if I is odd.

4. If $\Delta=r_1(r_2(1)+I-1)$, output $$x(l)=r_3(\Pi) \tag{39}$$

and then stop. Otherwise, check the value of $r_1(r_2(1)+I-2)$. If $r_1(r_2(1)+I-2)=0$, output $x(l)=0$ and stop. If $r_1(r_2(1)+I-2)\neq 0$, update I and $\Pi$, respectively, as follows $$I\leftarrow r_1(r_2(1)+I-2) \tag{40}$$

and $$\Pi\leftarrow \Pi-1 \tag{41}$$

Then repeat this step if I is even, and move to Step 5 if I is odd.

5. Check $r_1(r_2(I+1))$ to see if it is zero. Go to Step 6 if yes, and Step 8 if no.

6. If $r_2(I+2)-r_2(I+1)=1$, move to Step 7. Otherwise, use the bisection method to determine whether $\Delta$ appears in $r_1(k)$, $k=r_2(I+1)+1, \ldots, r_2(I+2)-1$. If $\Delta$ appears therein, determine the unique $1<t\leq r_2(I+2)-r_2(I+1)$ such that $$r_1(r_2(I+1)+t-1)=\Delta \tag{42}$$

output $$x(l)=r_3(\Pi-a_0+t) \tag{43}$$

where $$a_0 = \begin{cases} r_2(I+2) - r_2(I+1) & \text{if } r_2(I+3) - r_2(I+2) = 0 \\ r_2(I+2) - r_2(I+1) + r_1(r_2(I+3)-1) & \text{otherwise} \end{cases}$$

and then stop. If $\Delta$ does not appear therein, move to Step 7.

7. If $r_2(I+3)-r_2(I+2)=0$ or $\Delta < r_1(r_2(I+2))$, then output $x(l)=0$ and stop. Otherwise, use the bisection method to determine the largest k, $1 \le k \le (r_2(I+3)-r_2(I+2))/3$, such that $$r_1^s(r_2(I+2)+3k-3) \le \Delta$$

If $\Delta = r_1(r_2(I+2)+3k-3)$, output $$x(l)=r_3(\Pi-a_k+1) \tag{44}$$

where $$a_0 = \begin{cases} r_1(r_2(I+3)-1) & \text{if } k=1 \\ r_1(r_2(I+3)-1) + r_1(r_2(I+2)+3k-4) & \text{otherwise} \end{cases}$$

and then stop. If $\Delta \ne r_1(r_2(I+2)+3k-3)$, first update $\Delta$ and $\Pi$, respectively, as follows $$\Delta \leftarrow \Delta - r_1(r_2(I+2)+3k-3) \tag{45}$$

$$\Pi \leftarrow \Pi - (r_1(r_2(I+3)-1) - r_1(r_2(I+2)+3k-1)) \tag{46}$$

then update I according to $$I \leftarrow r_1(r_2(I+2)+3k-2) \tag{47}$$

and finally move to Step 4 if I is even, and Step 5 if I is odd.

8. If $r_2(I+3)-r_2(I+2)>0$, use the bisection method to determine whether $\Delta$ appears in $r_1(k)$, $k=r_2(I+2), \ldots, r_2(I+3)-1$. If $\Delta$ appears therein, then determine the unique $1 \le t \le r_2(I+3)-r_2(I+2)$ such that $$r_1(r_2(I+2)+t-1)=\Delta \tag{48}$$

output $$x(l)=r_3(\Pi-(r_2(I+3)-r_2(I+2))+t) \tag{49}$$

and stop. If $\Delta$ does not appear therein, update $\Pi$ as follows $$\Pi \leftarrow \Pi - (r_2(I+3)-r_2(I+2)) \tag{50}$$

and then move to Step 9.

9. Use the bisection method to determine the largest k, $1 \le k \le (r_2(I+2)-r_2(I+1)-2)/3$, such that $$r_1(r_2(I+1)+3k-1) \le \Delta \tag{51}$$

If such k satisfying (75) exists and $\Delta = r_1(r_2(I+1)+3k-1)$, then output $$x(l)=r_3(\Pi-(r_1(r_2(I+2)-1)-r_1(r_2(I+1)+3k-2))+1) \tag{52}$$

and stop. If such k satisfying (75) exists and $\Delta > r_1(r_2(I+1)+3k-1)$, first update $\Delta$ and $\Pi$, respectively, as follows $$\Delta \leftarrow \Delta - r_1(r_2(I+1)+3k-1) \tag{53}$$

$$\Pi \leftarrow \Pi - (r_1(r_2(I+2)-1) - r_1(r_2(I+1)+3k-1)) \tag{54}$$

then update I according to $$I \leftarrow r_1(r_2(I+1)+3k) \tag{55}$$

and finally go back to Step 4 if I is even, and Step 5 if I is odd. If such k satisfying (51) does not exist, first update $\Pi$ as follows $$\Pi \leftarrow \Pi - (r_1(r_2(I+2)-1) - r_1(r_2(I+1)+3)) \tag{56}$$

then update I according to $$I \leftarrow r_1(r_2(I+1)) \tag{57}$$

and finally go back to Step 4 if I is even, and Step 5 if I is odd.

As mentioned above, the description of the process is based on a simplifying assumption that $b=\lceil \log n \rceil$. It may be modified to account for the case $b \ne \lceil \log n \rceil$. Let $\Lambda$ denote the index value of $r_3$ in (34), (36), (39), (43), (44), (49), and (54). Let $$i = \left\lfloor \frac{\Lambda b}{\lceil \log n \rceil} \right\rfloor \tag{58}$$

and $$j=\Lambda b - i \lceil \log n \rceil \tag{59}$$

In other words, i and j are the quotient and remainder obtained by dividing $\Lambda b$ by $\lceil \log n \rceil$, respectively. When $b \ne \lceil \log n \rceil$, the step of outputting nonzero $x(l)$ in the above process should be modified accordingly. The nonzero $x(l)$ can be determined from $r_3(i)$ and $r_3(i+1)$ (if available); its b bits start from the (j+1)th bit of $r_3(i)$. As such, the process outputs the address of the nonzero $x(l)$ in $r_3(x|G)$, i.e., the values of $(i, j)$ computed according to (58) and (59), instead of the value of the b bits. This modification applies when $b \gg \lceil \log n \rceil$.

The process may be further illustrated by example, again with reference to the previous example grammar encoded as $r(x, G_0)$ and with $l=111$. In this case, step 1 results in $w(x)=r_1(14)+r_2(1)-r_2(0)=62+2=64$. As such, $\Delta$ and $\Pi$ are initially equal to 111 and 63, respectively. Assume that $b=\lceil \log n \rceil$. Executing Step 2, the process determines that $\Delta$ does not appear in $r_1(15)$, $r_1(16)$, updates $\Pi$ as $$\Pi \leftarrow 61=63-2$$

and then moves to Step 3. Using the bisection method, the process locates $r_1(6)=89 < \Delta < r_1(9)=149$, computes $I=r_1(7)=5$, and updates $\Delta$ and $\Pi$, respectively, as follows:

$$\Delta \leftarrow 22=111-89$$

and $$\Pi = r_1(8)-1=39$$

Since I is odd, move on to Step 5. Check $r_1(35)$, which is 0. Move to Step 6. Using the bisection method, the process determines that $\Delta=22$ does not appear in $r_1(36)$. Move on to Step 7. Using the bisection method, Algorithm D locates $r_1(37)=7 < \Delta < r_1(40)=40$, updates I, $\Delta$, and $\Pi$, respectively, as follows $$I=r_1(38)=1$$

$$\Delta \leftarrow 15=22-7$$

$$\Pi \leftarrow 36=39-(13-10)$$

and then moves to Step 5 again. Check $r_1(21)$, which is nonzero. Move to Step 8. Using the bisection method, the process determines that $\Delta=15$ does not appear in $r_1(29)$, $r_1(30)$, and updates $\Pi$ as $\Pi \leftarrow 34=36-(31-29)$. Move on to Step 9. Using the bisection method, the process locates $r_1(23)=11 < \Delta < r_1(26)=18$, updates I, $\Delta$, and $\Pi$, respectively, as follows $$I=r_1(24)=2$$

$$\Delta \leftarrow 4=15-11$$

$$\Pi \leftarrow 31=34-(8-5)$$

and moves on to Step 4. Compare Δ=4 with $r_1(18)$. Since Δ=$r_1(18)$, Algorithm D outputs $x(l)=r_3(31)$ and stops. It turns out that $r_3(31)$ is indeed equal to $x(111)$.

Figure 7:
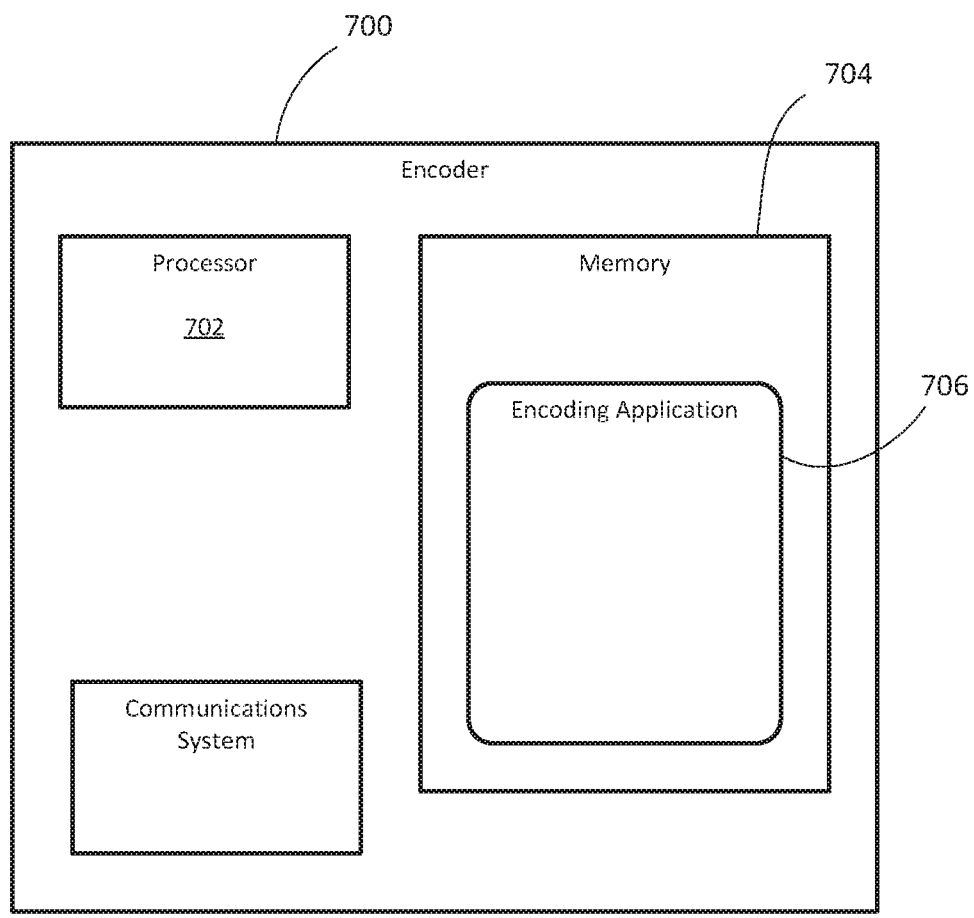
FIG. 7 shows, in block diagram form, a simplified example of an encoder in accordance with an aspect of the present application.

Reference is now also made to FIG. 7, which shows a simplified block diagram of an example embodiment of an encoder 700. The encoder 700 includes a processor 702, a memory 704, and an encoding application 706. The encoding application 706 may include a computer program or application stored in memory 704 and containing instructions that, when executed, cause the processor 702 to perform operations such as those described herein. It will be understood that the encoding application 706 may be stored in on a computer-readable medium, such as a compact disc, flash memory device, random access memory, hard drive, etc. When the instructions are executed, the processor 702 carries out the operations and functions specified in the instructions so as to operate as a special-purpose processor that implements the described process(es). Such a processor may be referred to as a "processor circuit" or "processor circuitry" in some examples. It will be appreciated that a decoder in accordance with the present application may be similarly implemented.

It will be appreciated that the decoder and/or encoder according to the present application may be implemented in a number of computing devices, including, without limitation, servers, suitably-programmed general purpose computers, audio/video encoding and playback devices, set-top television boxes, television broadcast equipment, and mobile devices. The decoder or encoder may be implemented by way of software containing instructions for configuring a processor or processors to carry out the functions described herein. The software instructions may be stored on any suitable non-transitory computer-readable memory, including CDs, RAM, ROM, Flash memory, etc.

It will be understood that the decoder and/or encoder described herein and the module, routine, process, thread, or other software component implementing the described method/process for configuring the encoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

Certain adaptations and modifications of the described embodiments can be made. Therefore, the above discussed embodiments are considered to be illustrative and not restrictive.

What is claimed is:

1. A method of encoding a sparse signal x to generate a compressed encoded signal, wherein the sparse signal x may be expressed as a set of non-zero positions in the sparse signal x and the component values of each respective non-zero position, the method comprising:
   generating a set $P(x)$ representing the set of non-zero positions in the sparse signal;
   transforming the set $P(x)$ into a localized directionless grammar G from which the set $P(x)$ can be recovered, wherein
   the localized directionless grammar G is defined by a set of production rules, each containing two or more labelled sets,
   at least two of the labelled sets contain a variable associated with one of the production rules, the variable representing a disjoint, repeated subset within the set $P(x)$, and
   subsets represented by distinct variables are distinct up to translation;
   using a grammar dimension encoder to encode the localized directionless grammar G into an output vector; and
   encoding the values of the non-zero components of the sparse signal x conditionally given the localized directionless grammar G.

2. The method claimed in claim 1, wherein transforming the set $P(x)$ into a localized directionless grammar G comprises:
   generating an initial directionless grammar consisting of an initial production rule containing, as its right member, a plurality of labelled sets, the plurality including one labelled set for each element in the set $P(x)$;
   finding a disjoint repeated subset with cardinality greater than or equal to 2 within the plurality of labelled sets;
   subtracting the disjoint repeated subset from the initial production rule with trace at the least position of elements in the repeated subset;
   generating a new production rule representing a translation of the repeated subset, the new production rule being associated with a new variable; and
   generating a revised directionless grammar comprising the initial production rule and the new production rule.

3. The method claimed in claim 2, further comprising
   finding further disjoint repeated subsets within one or more production rules in the revised directionless grammar;
   subtracting the further disjoint repeated subsets from the one or more production rules in the revised directionless grammar with trace at the least position of elements in these further repeated subsets;
   adding a further production rule representing a translation of the further repeated subset to update the revised grammar, the further production rule being associated with a further variable; and
   repeating the above steps until no disjoint repeated subsets with cardinality greater than or equal to a threshold remain in the revised grammar.

4. The method claimed in claim 3, further comprising purging the production rules of any variables that only appear once in the set of production rules.

5. The method claimed in claim 3, wherein the threshold is greater than or equal to 2.

6. The method claimed in claim 1, wherein transforming the set $P(x)$ into a localized directionless grammar G comprises:
   generating a plurality of labelled sets, the plurality including one labelled set for each element in the set $P(x)$;
   incrementally partitioning, in increasing order of positions, the plurality of labelled sets into a plurality of disjoint subsets of the labelled sets, with all but one of the plurality of disjoint subsets being distinct up to translation;
   forming an initial set of production rules using the disjoint subsets, wherein at least some of the production rules are associated with a respective variable indicative of a repeated subset; and
   pruning the initial set of production rules to produce the localized directionless grammar G.

7. The method claimed in claim 6, wherein incrementally partitioning is based on any disjoint subset with cardinality greater than or equal to 3 being equal to a union of a translation of another of the disjoint subsets with one of the plurality of labelled sets.

8. The method claimed in claim 7, wherein forming an initial set of production rules comprises, with respect to a disjoint subset with cardinality greater than or equal to 3, replacing the translation of the another of the disjoint subsets with a variable associated with said another of the disjoint subsets.

9. The method claimed in claim 6, wherein pruning comprises, for a variable that appears only once in the right hand side of the initial set of production rules, expanding the production rule in which it appears to eliminate that variable and its associated production rule.

10. The method claimed in claim 1, wherein each production rule contains two or more elements, each element being a labelled set containing its position and a label, and wherein encoding the localized directionless grammar comprises:
   using a prescribed set of grouping rules, rearranging elements of the localized directionless grammar so as to group elements in each production rule based on whether the element's label is a terminal symbol or a variable;
   traversing the elements of the production rules in a prescribed order and extracting element information to form a first vector from the extracted element information;
   replacing the terminal symbol and any variables in the first vector with prescribed indices;
   generating a second vector encoding the number of variables and terminal symbols in respective production rules; and
   forming the output vector from the first vector, the second vector and size information for at least one of the first vector and the second vector.

11. The method claimed in claim 10, wherein the prescribed set of grouping rules specify that rearranging elements comprises, for a first production rule, sorting elements that contain variables in increasing order of their respective positions and then elements that contain the terminal symbol in increasing order of their respective positions.

12. The method claimed in claim 10, wherein the prescribed order for traversing the elements comprises a first production rule and by every second production rule thereafter, and followed by a second production rule immediately next to the first production rule, and every second production rule thereafter.

13. The method claimed in claim 10, wherein the extracted element information is dependent upon whether the element is in a first production rule and whether the element contains a variable.

14. The method claimed in claim 13, wherein if the element is in the first production rule, then the extracted element information includes the element's position and variable if that element contains a variable, and includes only the element's position if that element contains the terminal symbol.

15. The method claimed in claim 14, wherein the element is not in the first production rule, and wherein
   if the element is the first element in its production rule, then the extracted information includes the element's label and not its position; and
   otherwise, the extracted element information includes the element's position and variable if that element contains a variable, and includes only the element's position if that element contains the terminal symbol.

16. The method claimed in claim 14, wherein if the element is in the first production rule and contains a variable, then the extracted element information further includes its cumulative size value equal to the sum of sizes of all elements appearing in the first production rule up to and including that element.

17. The method claimed in claim 10, wherein each of the variables has an index, wherein replacing comprises replacing the terminal symbol with a set value, and wherein replacing the variables comprises replacing each variable with the value of its index.

18. An encoder to encode a sparse signal x to generate a compressed encoded signal, wherein the sparse signal x may be expressed as a set of non-zero positions in the sparse signal x and the component values of each respective non-zero position, the encoder comprising:
   a processor;
   a memory; and
   an encoding application containing processor-executable instructions that, when executed by the processor, cause the processor to:
   generate a set P(x) representing the set of non-zero positions in the sparse signal,
   transform the set P(x) into a localized directionless grammar G from which the set P(x) can be recovered, wherein
      the localized directionless grammar G is defined by a set of production rules, each containing two or more labelled sets,
      at least two of the labelled sets contain a variable associated with one of the production rules, the variable representing a disjoint, repeated subset within the set P(x), and
      subsets represented by distinct variables are distinct up to translation,
   use a grammar dimension encoder to encode the localized directionless grammar G into an output vector, and
   encode the values of the non-zero components of the sparse signal x conditionally given the localized directionless grammar G.

19. A method of randomly accessing a component of a sparse signal through a vector representing compression of the sparse signal x without full decoding of the vector, the vector being formed as concatenation of at least a first vector and a second vector, the vectors having resulted from grammar dimension encoding of a localized directionless grammar, the localized directionless grammar representing a transform of a set P(x) representing the non-zero positions in the sparse signal, the first vector being an encoding of position and variable information for production rules of the localized directionless grammar, the second vector being an encoding of the number of variables and terminal symbols in respective production rules, the method comprising:
   initializing a position offset based on an input index to the sparse signal; and
   recursively, determining whether, using a bisection method applied to the first vector and using the second vector, the position offset appears in one of two selected elements of the first vector and,
      if so, outputting a determination that the input index is a non-zero value of the sparse signal, and,
      if not, determining whether a condition for halting the recursive determining is met and, if so, outputting a determination that the input index is a zero value of the sparse signal, and, if not, updating the position offset and repeating the recursive determining.

* * * * *